(12) United States Patent
Bosshart

(10) Patent No.: US 8,473,891 B1
(45) Date of Patent: Jun. 25, 2013

(54) SYSTEM AND METHOD FOR INTEGRATED CIRCUIT LAYOUT EDITING USING REFERENCE FRAMES

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/362,906

(22) Filed: Jan. 31, 2012

(51) Int. Cl.
*G06F 17/50* (2006.01)
(52) U.S. Cl.
USPC ............ 716/139; 716/126; 716/129; 716/130
(58) Field of Classification Search
USPC .................................. 716/126, 129, 130, 139
See application file for complete search history.

(56) References Cited

U.S. PATENT DOCUMENTS 5,983,376 A * 11/1999 Narayanan et al. ........... 714/726
2002/0124230 A1* 9/2002 Cai et al. ............................ 716/6
2009/0288054 A1* 11/2009 Okamoto ......................... 716/10

OTHER PUBLICATIONS

Kommuru et al., "ASIC Design Flow Tutorial Using Synopsys Tools", (San Francisco State University, 2009), available at http://userwww.sfsu.edu/~necrc/files/synopsys%20tutorials/ASIC%20Design%20Flow%20Tutorial.pdf, pp. 1-11, 92-102.

* cited by examiner

*Primary Examiner* — Vuthe Siek
(74) *Attorney, Agent, or Firm* — John R. Pessetto; W. James Brady; Frederick J. Telecky, Jr.

(57) ABSTRACT

An automated system, and method of operating the same, for editing the floorplan, placement, and toplevel wiring routing in a layout of an integrated circuit. Components in the layout of the integrated circuit, such components including functional blocks or subchips, and also wire segments of the toplevel wiring, are associated with horizontal reference frames and vertical reference frames. Each reference frame has its position, in the orthogonal direction, specified by a position of a reference line. The positions of subchips and wire segments within the reference frame are expressed as offsets from the reference line. Movement of components is accomplished by moving the reference frame in the orthogonal direction, and updating the reference line position while maintaining the offset values constant.

27 Claims, 16 Drawing Sheets

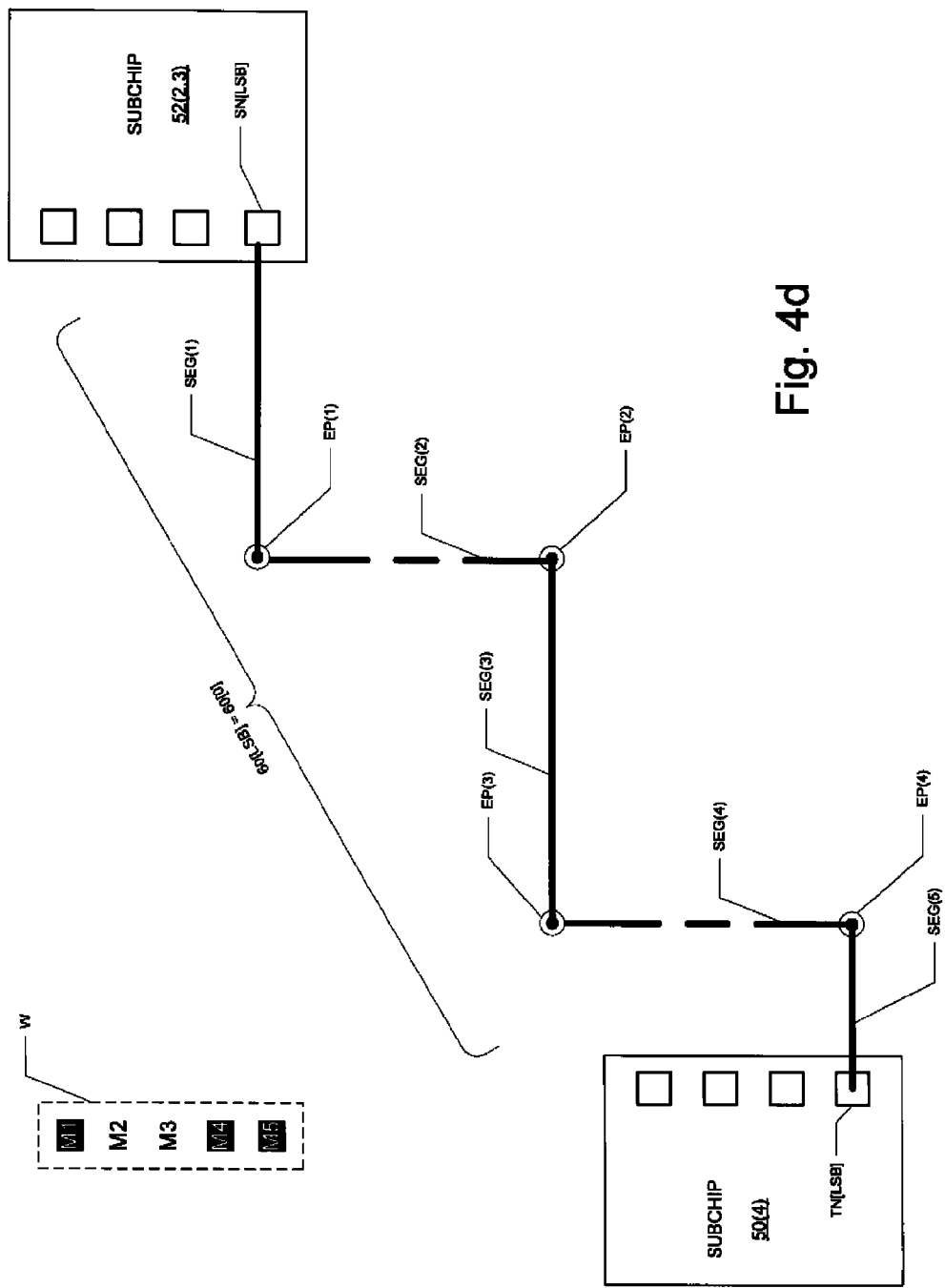

SYSTEM AND METHOD FOR INTEGRATED CIRCUIT LAYOUT EDITING USING REFERENCE FRAMES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of solid-state integrated circuits. Embodiments of this invention are directed to computer-implemented tools for designing the layout of such integrated circuits.

Advances in semiconductor technology in recent years have enabled the shrinking of minimum device feature sizes, such as metal-oxide-semiconductor (MOS) transistor gates, into the deep sub-micron range. For example, according to some advanced manufacturing technologies as of this date, the target MOS transistor gate width after etch is on the order of 30 nm. This continuing trend toward smaller device sizes, in combination with continuing improvement in manufacturing technology, have enabled the functionality of very large-scale integrated circuits to greatly increase. A single modern integrated circuit can now contain over one billion transistors, with that number expected to continue to increase as still-smaller technology "nodes" become manufacturable. The ability to realize so many active devices in a single integrated circuit has, of course, resulted in the integration of complex functionality into that integrated circuit, including computing resources operating on very wide data words (e.g., sixty-four bits or wider).

As the number of transistors embodied in a single integrated circuit has increased to such levels, the task of designing the integrated circuit to attain the resulting functional complexity has also become quite complex. Also involved in the implementation of such functionality into an integrated circuit is the task of defining the physical position and physical attributes of each active device, passive device, and interconnection among those devices, to such an extent that photomasks can be created to define those elements in each of the various material layers to be involved in the physical construction of the integrated circuit. As known in the art, this task is referred to as "layout".

A conventional approach to facilitating the design and layout of very large scale integrated circuits, particularly such an integrated circuit that is to carry out a specific function (e.g., a particular computational or control function desired by a system manufacturer), is referred to as the "ASIC" ("Application-Specific Integrated Circuit") design flow. According to this approach, the integrated circuit layout appears as multiple previously-designed and laid-out circuit blocks (i.e., standard cells) for specific functions, memories, and input/output cells arranged in a somewhat regular grid within the rectangular boundaries of the integrated circuit. Interconnections among the various standard cells, I/O blocks, and memories reside in overlying conductor layers.

As known in the art, the ASIC design flow now typically uses commercially-available design tools to convert a system specification into a data file (e.g., the "pattern generation" or "PG" file) from which photomasks can be constructed for manufacture of the integrated circuit. FIG. 1a is a somewhat simplified high-level flow diagram illustrating a typical conventional ASIC design flow. In process 10, the system specifications are defined by the design team. These specifications of course include the desired functionality and performance of the integrated circuit, as well as any constraints (e.g., maximum chip area, power dissipation). In addition, process 10 identifies the manufacturing technology to be used in the manufacture of the integrated circuit (e.g., twin-well CMOS), including the minimum device sizes available for the technology. The specifications defined in process 10 also include functional and architectural specifications, such as the class of instruction set to be implemented (e.g., RISC or CISC), functional features such as pipelining and the number of "cores" for processing units in the integrated circuit. Typical functional and architectural specifications for modern ASICs also break down the overall functionality into various subchips, and identify the relationship between those subchips and the overall, "top-level", system.

These system specifications defined in process 10 serve as the input for logic design process 12. This process 12 implements the system specification into a logic representation of the integrated circuit, for example at a level including sequential or combinatorial logic, Boolean expressions, registers, and the like. This logic representation is typically expressed in a "hardware description language" ("HDL"), as known in the art. Verification that the resulting HDL expression of the integrated circuit corresponds to the higher-level system specifications is typically performed.

In this high-level ASIC flow, the HDL expression of the integrated circuit is then converted into a "gate level netlist" by way of logic synthesis process 14. Conventional synthesis tools are available in the industry to assist the design team in carrying out synthesis process 14. As known in the art, these synthesis tools receive the HDL representation, along with the desired library of "standard cells" available for use in the design, and creates a list of the interconnections, at the gate level, between the various logic functions in the device. Cost constraints are generally applied in synthesis process 14, so that an optimal netlist for a particular manufacturing technology and process can be selected. Typically, in a standard cell ASIC design, the netlist is a complete structural description of the integrated circuit, with each "net" referring to an interconnection among two or more standard cell nodes (or an input/output pad). Simulation can be applied to this structural description, to verify the logic design and perhaps to confirm high level performance.

Physical implementation process 16 turns the netlist and standard cells from process 14 into a geometric representation of the physical layout of the integrated circuit. The desired result of physical implementation process 16 is a data file (PG file) from which photomasks can be generated for use in defining physical features in the various layers of the selected manufacturing technology, in the manufacture of integrated circuits in process 16.

FIG. 1b illustrates a typical flow for carrying out physical implementation process 16, according to conventional approaches. In a general sense, physical implementation process 16 begins with "floorplanning" the integrated circuit (process 13). Floorplanning process 13 defines the high level arrangement of the physical integrated circuit, including identification of the width and length of the eventual integrated circuit. Modern ASIC layouts arrange the subchips (i.e., standard cells, memory blocks, and I/O functions) according to a gridded ("Manhattan") approach. The routing of power supply voltages is also defined in the floorplanning stage, since each subchip will require at least one power supply voltage and a corresponding ground or reference voltage. The location of input/output blocks and external connections "pads" can also be selected in floorplanning process 13. In placement process 15, the locations of the subchips in the floorplan defined in process 13 are selected. Circuit macros and logic gates within each of those subchips are also arranged and located within the physical floorplan as part of placement process 15.

Following placement process 15 (and any verification desired by the design team), routing process 17 is then carried out to define the geometric placement of interconnections between the subchips as placed in process 13, and of course based on the netlist from logic synthesis process 14. According to conventional ASIC layout techniques, a grid of horizontal and vertical "wiring tracks" overlays the layout of the integrated circuit. As mentioned above, the power and ground buses are assigned to specific tracks, creating power and ground "meshes" in this overlay. The remaining tracks can be used for interconnects between subchips. In this grid arrangement, interconnects are generally constrained to running either in a horizontal or vertical directions along tracks. Typically, one conductor layer is dedicated to horizontal interconnect segments, and another, adjacent, conductor layer is dedicated to vertical interconnect segments; for example, even-numbered conductor layers (e.g., "the metal 2 level") may be dedicated to horizontal interconnect segments in the x-y plane, with odd-numbered conductor layers (e.g., "the metal 3 level") dedicated to vertical segments in that plane. Vias through the intervening insulator layers form connections among the various conductor layers.

Interconnects in an integrated circuit design can be routed manually, typically by a design engineer interactively selecting the routing path for each interconnect in the layout. Manual routing can provide a highly regular pattern of interconnects, with optimal utilization of wiring tracks and routing resources. However, manual routing is a prohibitively time-consuming, expensive, and error-prone task for modern complex integrated circuits, especially those with many subchips and input/output resources, and ultra-wide data word widths. The difficulties of manual routing are exacerbated as the integrated circuit becomes relatively large in chip area, because the routing of long on-chip interconnect distances, the large number of geometries, and the necessarily-occurring irregularities in such large devices complicate the routing problem. Worse yet, a small change in a routing path, or an interconnect line width, can result in a "domino effect", necessitating changes in hundreds of other interconnects beginning with near neighbors. Manual routing has therefore become essentially impractical for integrated circuits of moderate and higher complexity.

At the other end of the spectrum, automated router software packages ("autorouters") are available for carrying out routing process 17 with greatly improved efficiency relative to manual routing. Autorouter tools operate by deriving an interconnect routing that reflects the netlist of the circuit, as applied to the result of placement process 15. However, it has been observed that wiring derived by such automated routing tools typically appears somewhat random, with little regularity exhibited in the interconnect paths. For example, autorouted integrated circuits typically do not include data bus structures, in which parallel interconnects for multiple bits in a data word run largely in parallel between their endpoints. Rather, the individual wires in potential data buses can follow paths that are largely independent of one another. In addition, it has been observed that autorouters tend to under-utilize the available wiring tracks as compared with manual routing efforts. In the worst case, designs having a significant amount of "top-level" wiring, in the form of wide data buses that heavily utilize the available metal resources, often result in the autorouter not converging to a routing solution.

Some design engineers use a combination of manual routing and autorouting to arrive at the layout of interconnections. For example, the design engineer may manually route some of the interconnections, and allow the autorouter to make the rest of the connections, constrained by the manually routed paths. This combination can attain good area efficiency and regularity in many of the interconnections, while avoiding the painstaking routing involved with the remaining more random wires.

By way of further background, my copending and commonly assigned U.S. application Ser. No. 13/297,086 entitled "An Interactive Routing Editor with Symbolic and Geometric Views for Integrated Circuit Layout", filed Nov. 15, 2011 and incorporated herein by reference, describes an automated system and method for interactively routing interconnections in a layout of an integrated circuit. Top level interconnections among subchips in the integrated circuit, specified by a netlist, and that are arranged as a bus, are displayed in a symbolic view by a representative wire of the bus, for example the least-significant or most-significant bit position in the bus. The physical routing of the representative wire is interactively defined, using orthogonal wire segments of the representative wire in selected conductor levels. Bus properties, for example including bit pitch, wire pitch, LSB/MSB (when displayed in the symbolic view), and a direction of expansion, are associated with the routing data for each segment of the representative wire. By combining the routing data and the bus property data, the system can build the entire bus for display in a geometric view.

As known in the art, it is common for the floorplan of an integrated circuit layout to change, for any one of a number of reasons, at a late stage in the design process. Examples of these floorplan changes include changes in the arrangement or size of one or more toplevel blocks (i.e., subchips), relatively small adjustments to the position of blocks (such as to accommodate size or shape changes of the adjusted blocks themselves, or of neighboring blocks), adjustments to the spacing between blocks, up to wholesale rearrangement of blocks in the floorplan. Such changes in the floorplan after the interconnections have been partially or fully routed will of course require changes in the affected wiring.

In conventional design systems, re-routing of toplevel interconnections following a change in the floorplan is typically performed manually. Even for small floorplan changes, the time and effort required for updating the routing can be significant, and in some cases can consume as much manpower and time as the original routing. Floorplan changes occurring late in the layout process can of course be especially costly in design time and the product development schedule. This extreme cost of re-routing can, in some cases, necessitate "freezing" the layout, foregoing the potential benefit in performance or chip area that may have been available if the floorplan could have been adjusted.

BRIEF SUMMARY OF THE INVENTION

Embodiments of this invention provide a method and corresponding system that facilitates modifications to the floorplan layout of a very-large-scale integrated circuit, even after routing of interconnections ("wires") has been performed.

Embodiments of this invention provide such a method and system that enables efficient and accurate movement of subchip components and top-level wiring.

Embodiments of this invention provide such a method and system that reduces errors in subchip and wiring placement following post-routing alteration of the floorplan.

Embodiments of this invention provide such a method and system that is compatible with and applicable to layout data that are "read in" from an existing database.

Other objects and advantages of embodiments of this invention will be apparent to those of ordinary skill in the art having reference to the following specification together with its drawings.

An embodiment of this invention may be implemented into a computer system, and method of operating a computer system, for assisting the modification of the top-level floorplan of an integrated circuit layout, after the routing of interconnections ("wires") in that layout has been at least partially performed. Horizontal and vertical reference frames are defined for the chip area, each reference frame including one or more subchip components, and also certain top-level interconnections ("wires") that have already been routed. Each reference frame is defined by a reference line running with the reference frame, at an identified position along the orthogonal axis. More specifically, a horizontal reference frame has a horizontal reference line located at an absolute vertical position, and a vertical reference frame has a vertical reference line located at an absolute horizontal position. The positions of each subchip, and each wire segment parallel to the reference line, within a reference frame are defined by offsets to the reference line. A human user can move an entire reference frame, including all subchips and parallel wire segments in that reference frame, in a direction orthogonal to its reference line. The absolute position of the reference line is then updated with its new position, while the subchip and wire segment offsets within the reference frame remain the same. Endpoints of the perpendicular wire segments connected to wire segments within the moved reference frame move with the reference frame.

BRIEF DESCRIPTION OF THE SEVERAL VIEWS OF THE DRAWING

FIGS. 4a through 4e are plan views of an example of the layout of an integrated circuit that can be edited according to embodiments of the invention.

DETAILED DESCRIPTION OF THE INVENTION

This invention will be described in connection with one or more of its embodiments, namely as implemented into a networked computer system used in the design and layout of an application specific integrated circuit (ASIC), because it is contemplated that the invention will be especially beneficial in such an application. However, it is also contemplated that invention will be useful and beneficial if applied to other design and layout tasks, for other types of devices. Accordingly, it is to be understood that the following description is provided by way of example only, and is not intended to limit the true scope of this invention as claimed.

Design and Layout Automation System

Figure 2:
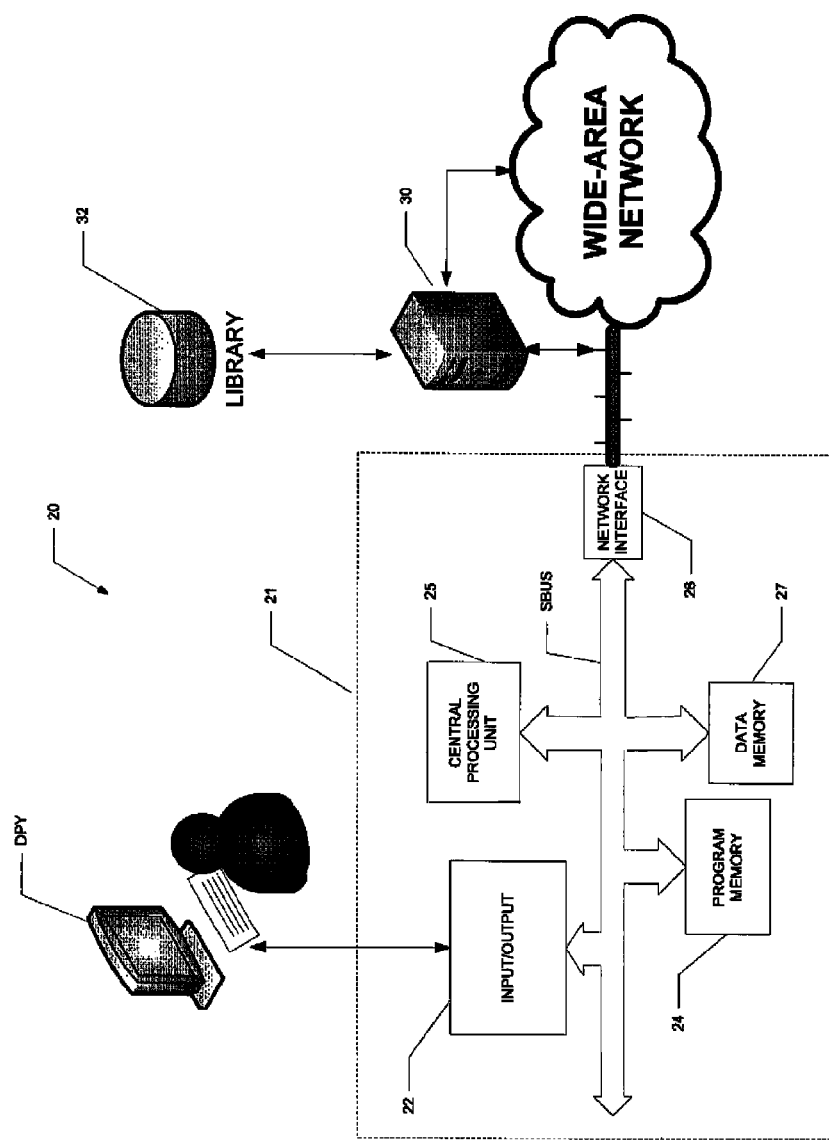
FIG. 2 is an electrical diagram, in block form, of a design and layout automation system programmed to enable routing of interconnections in the layout of an integrated circuit according to embodiments of the invention.

Referring now to FIG. 2, a networked example of design and layout automation system 20 as useful in generating a layout of a VLSI integrated circuit according to embodiments of this invention, will now be described. In this example, system 20 is as realized by way of a computer system including workstation 21 connected to server 30 by way of a network. Of course, the particular architecture and construction of a computer system useful in connection with this invention can vary widely. For example, system 20 may be realized by a single physical computer, such as a conventional workstation or personal computer, or alternatively by a computer system implemented in a distributed manner over multiple physical computers. Accordingly, the generalized architecture illustrated in FIG. 2 is provided by way of example only.

As shown in FIG. 2, workstation 21 includes central processing unit 25, coupled to system bus SBUS. Also coupled to system bus SBUS is input/output interface 22, which refers to those interface resources by way of which a keyboard, a pointing device (mouse, trackball, etc.), display DPY, and other peripheral functions interface with the other constituents of workstation 21. Central processing unit 25 refers to the data processing capability of workstation 21, and as such may be implemented by one or more CPU cores, co-processing circuitry, and the like. The particular construction and capability of central processing unit 25 is selected according to the application needs of workstation 21, such needs including, at a minimum, the carrying out of the functions described in this specification, and also including such other functions as may be desired to be executed by system 20. In the architecture of system 20 according to this example, program memory 24 and data memory 27 are coupled to central processing unit 25 by way of system bus SBUS.

Program memory 24 stores the computer instructions to be executed by central processing unit 25 in carrying out those functions. More specifically, program memory 24 is a computer-readable medium storing executable computer program instructions according to which the operations described in this specification are carried out by system 20, specifically by central processing unit 25 of workstation 21. Alternatively, these computer program instructions may be stored at and executed by server 30, in the form of a "web-based" application, upon input data communicated from workstation 21, to create output data and results that are communicated to workstation 21 for display or output in a form useful to a human user. Data memory 27 provides memory resources of the desired type useful as data memory for storing input data and the results of processing executed by central processing unit 25. Of course, this memory arrangement is only an example, it being understood that data memory 27 and program memory 24 may be included within a unified physical memory resource, or distributed in whole or in part outside of workstation 21.

Network interface 26 of workstation 21 is a conventional interface or adapter by way of which workstation 21 accesses network resources on a network. As shown in FIG. 2, the network resources to which workstation 21 has access via network interface 26 includes server 30, which resides on a local area network, or a wide-area network such as an intranet, a virtual private network, or over the Internet, and which is accessible to workstation 21 by way of one of those network arrangements and by corresponding wired or wireless (or both) communication facilities. In this embodiment of the invention, server 30 is a computer system, of a conventional architecture similar, in a general sense, to that of workstation 21, and as such includes one or more central processing units, system buses, and memory resources, network interface functions, and the like.

Library 32 is also available to server 30 (and perhaps directly accessible to workstation 21 over the local area or wide area network), and stores previously generated design data for the integrated circuit under design. For example, following the conventional ASIC design flow as described above in connection with FIGS. 1a and 1b, the design data for the integrated circuit being designed include the system specifications of that integrated circuit, the hardware description language (HDL) register level description of the integrated circuit, a netlist generated by conventional logic synthesis, data indicative of the floor-planning and placement of subchips at locations of the integrated circuit, design rules, and the like, and the routing of interconnections among those subchips (i.e., the "top-level" wiring). Additional detail regarding the design data upon which system 20 operates according to embodiments of this invention will be described below. Library 32 may instead or additionally reside on another local area network, or alternatively be accessible via the Internet or some other wide area network. It is contemplated that library 32 may also be accessible to other associated computers in such an overall network, so that other personnel in the design team can simultaneously be carrying out other tasks in connection with this integrated circuit.

Of course, the particular memory resource or location at which library 32 and program memory 24 physically reside can be implemented in various locations accessible to system 20. For example, these data and program instructions may be stored in local memory resources within workstation 21, within server 30, or in remote memory resources that are network-accessible to these functions. In addition, each of these data and program memory resources can itself be distributed among multiple locations, as known in the art. It is contemplated that those skilled in the art will be readily able to implement the storage and retrieval of the applicable information useful in connection with this embodiment of the invention, in a suitable manner for each particular application.

According to this embodiment of the invention, by way of example, program memory 24 stores computer instructions executable by central processing unit 25 to carry out the functions described in this specification, by way of which the physical layout of subchips and top-level interconnects in the layout of the integrated circuit under design can be designed and edited. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions may be written in a conventional high level language, either as a conventional linear computer program or arranged for execution in an object-oriented manner. These instructions may also be embedded within a higher-level application.

It is contemplated that those skilled in the art having reference to this description will be readily able to realize, without undue experimentation, this embodiment of the invention in a suitable manner for the desired installations. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions may have originally been stored on a removable or other non-volatile computer-readable storage medium (e.g., a DVD disk, flash memory, or the like), or downloaded as encoded information on an electromagnetic carrier signal, for example in the form of a software package from which the computer-executable software instructions were installed by system 20 in the conventional manner for software installation.

Operation of the Layout Editor

Embodiments of this invention are directed to the operation of system 20 in designing a physical layout of a VLSI integrated circuit, such as an application specific integrated circuit (ASIC). As will become evident from the following description, embodiments of this invention may be applied to the layout of integrated circuits of essentially any size or complexity, including the billion-transistor ASICs now being commonly produced in the industry. Indeed, embodiments of this invention facilitate changing and modifying the layout and overall design flow of such highly complex VLSI integrated circuits, including at stages of the layout and design flow after the routing of top-level wiring among the functional blocks (i.e., subchips) placed in the floorplan of the layout.

As discussed above, late-stage changes in the design of integrated circuits can often require substantial design effort to modify the floorplanning and routing efforts previously performed, especially in the design and layout of highly complex very-large scale integrated circuits in which the functionality is implemented into multiple functional blocks or subchips interconnected by top-level wiring among those functional blocks. Often, these changes involve changes (typically increases) in the size of one or more subchips within the floorplan, which requires surrounding subchips to be moved in order to accommodate those changes and maximize chip area utilization. Changes in the shape of one or more subchips and adjustment of the spaces between subchips are also common post-routing floorplan revisions. In some cases, wholesale revision of the arrangement of subchips within the floorplan is performed after some or all of the routing of toplevel wiring has been performed.

Figure 1B:
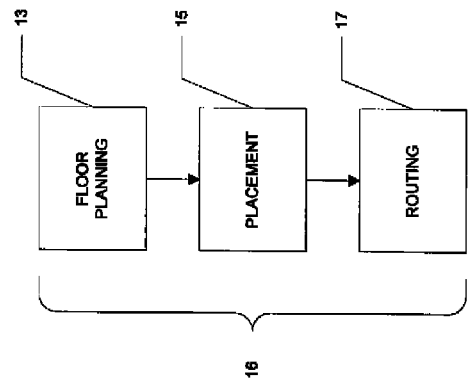
FIGS. 1a and 1b are flow diagrams illustrating a conventional design and layout flow for an application specific integrated circuit (ASIC).
Figure 1A:
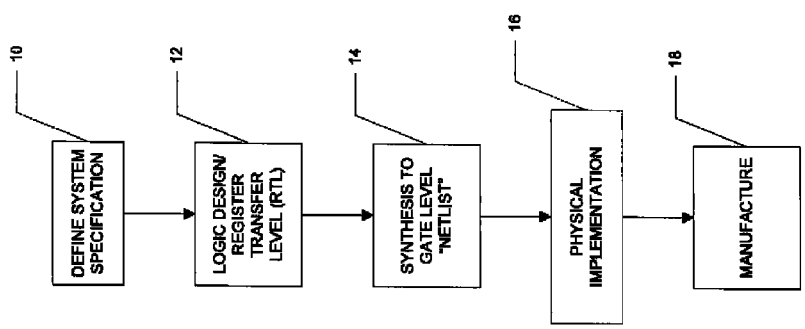
Figure 3:
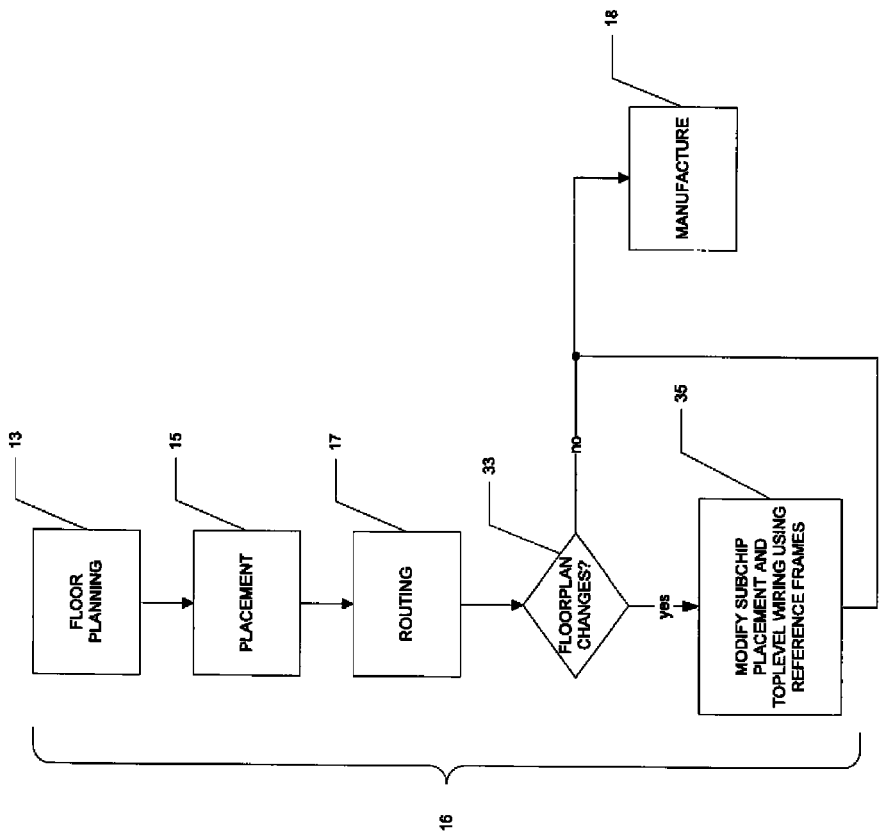
FIG. 3 is a flow diagram illustrating the operation of the system of FIG. 2 in an overall design and layout flow according to embodiments of the invention.

FIG. 3 illustrates an overall design flow according to which embodiments of this invention accomplishes these post-routing revisions to the size, shape, and placement of functional blocks or subchips that realize the large-scale integrated circuit, as applied to the conventional ASIC flow shown in FIGS. 1a and 1b. According to embodiments of this invention, routing process 17 within the physical implementation phase (process 16) of the overall ASIC design flow is performed, at least in part, to define the location of toplevel wiring among the functional blocks of the integrated circuit. Routing process 17 may be carried out manually, using an automatic routing software package ("autorouter"), or some combination of the two. A particularly useful routing editor and method is described in my copending and commonly assigned U.S. application Ser. No. 13/297,086 entitled "An Interactive Routing Editor with Symbolic and Geometric Views for Integrated Circuit Layout", filed Nov. 15, 2011 and incorporated herein by reference. In any case, following the partial or complete routing of toplevel wiring in process 17, and in response to the layout designer desiring to make floorplan changes (decision 33 is "yes"), modification process 35 can be performed, according to embodiments of this invention, in which the placement of subchips and of toplevel wiring is modified using "reference frames", as will be described in detail below. Following modification process 35, or if no floorplan changes were required after routing process 17 (decision 33 is "no"), manufacture of the photomasks and eventually the integrated circuit itself is carried out via process 18.

FIGS. 4a through 4e illustrate an example of the context of modification process 35 according to embodiments of this invention, by way of an example of the floorplan of integrated circuit 45. In this example, integrated circuit 45 includes multiple functional blocks, which will be referred to as subchips 50, 52 placed within the chip boundary of integrated circuit 45. As shown by this example, subchips 50, 52 are each essentially rectangular in shape, but can vary from one another in length (in the horizontal dimension in the x-y plane) and height (in the vertical dimension). As mentioned above, subchips 50, 52 each correspond to a collection of circuit functions, examples of such circuit functions including standard cells, memory resources, input/output blocks, one or more logic gates, etc. Not all of the available space may contain an instance of subchip 50, 52. Of course, maximum utilization of the chip area is desirable.

Figure 4A:
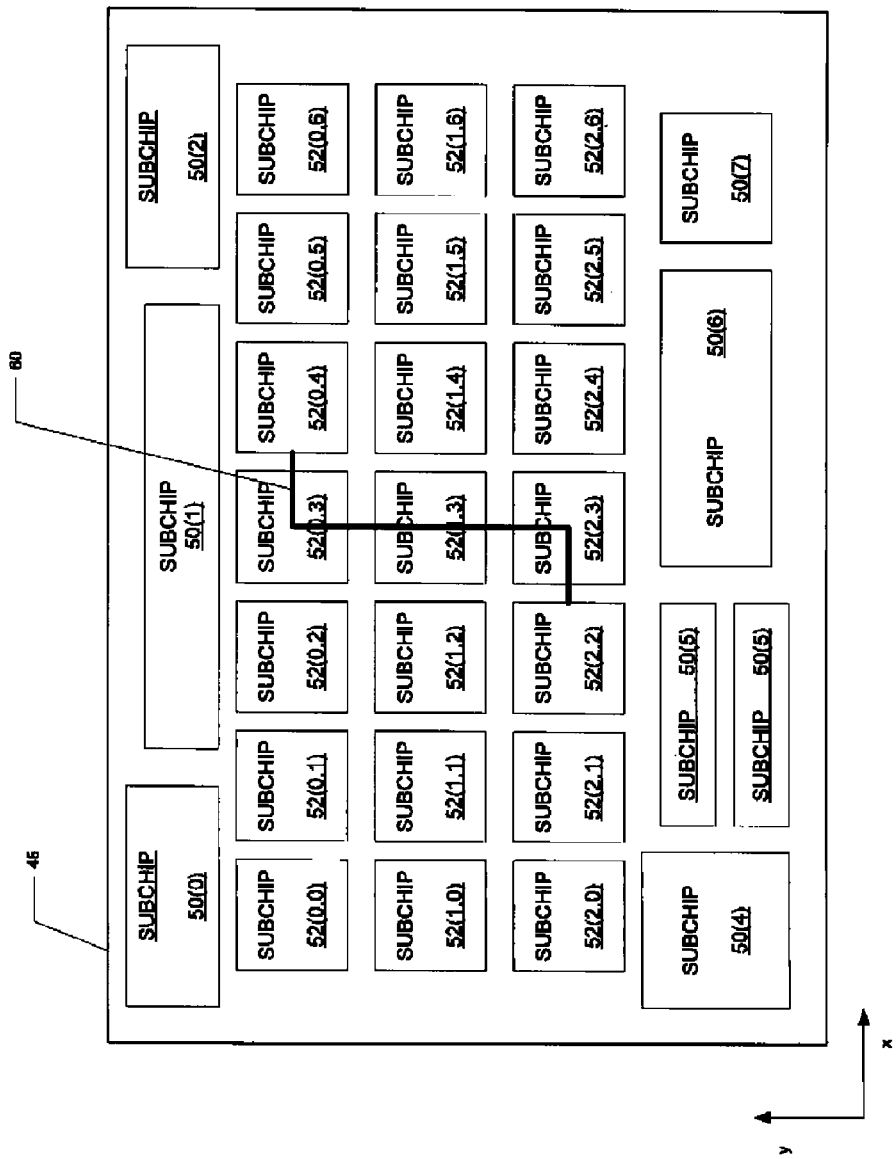

In the example of FIG. 4a, subchips 52 correspond to functional blocks having approximately the same size as one another, and as such that are suitable for arrangement in an array within the boundary of integrated circuit 45. For example, subchips 52 may be blocks or sub-arrays of a solid-state memory function within integrated circuit 45, similar logic functions that operate in parallel with one another within the architecture of integrated circuit 45, or simply logic or memory functions that are realized by chip area of similar size and shape. In this example, subchips 52 are arranged in an array having three rows of seven columns, with subchip 52(j,k) residing in row j and column k of that array. In this case, the rows of subchips 52 extend across the full width of integrated circuit 45, while the columns extend only over a portion of the height of integrated circuit 45 (in the orientation of FIG. 4a). The arrangement of subchips 52 of similar size and shape into an array, in the manner shown in FIG. 4a, is especially convenient for implementing embodiments of this invention. However, it is contemplated that the floorplan of integrated circuit 45 may alternatively include only subchips 50, 52 of varying sizes, to such an extent that no two are alike.

At the stage of the design process of FIG. 3 at which modification process 35 may be invoked, at least part of routing process 17 has been performed so as to define the routing of toplevel wiring in integrated circuit 45. As described above and as applicable to the example of FIG. 4a, toplevel wiring refers to interconnections among subchips 50, 52. Many such toplevel interconnections will typically be routed, especially in cases in which multiple metal levels are available. For clarity, only one such toplevel interconnection is illustrated in FIG. 4a, namely the example of toplevel wire 60 extending between subchip 52(2,2) and subchip 52(0,4). According to embodiments of this invention, and as will be evident from the following description, each toplevel interconnection is routed to include multiple orthogonal wire segments, each of those segments extending in a direction parallel to an edge of integrated circuit 45. In the arrangement of FIG. 4a, wire 60 includes two horizontal wire segments (each extending in the "x" direction) with one vertical wire segment (extending in the "y" direction) connecting the two. Typically, the horizontal wire segments are realized in a different metal level from the vertical wire segments, to facilitate routing of multiple wires 60. Vias between the two metal levels will be located in integrated circuit 45 at the endpoints of the respective wire segments, upon manufacture; the photomask database defined in physical implementation process 16 will include the appropriate pattern for these vias.

Figure 4B:
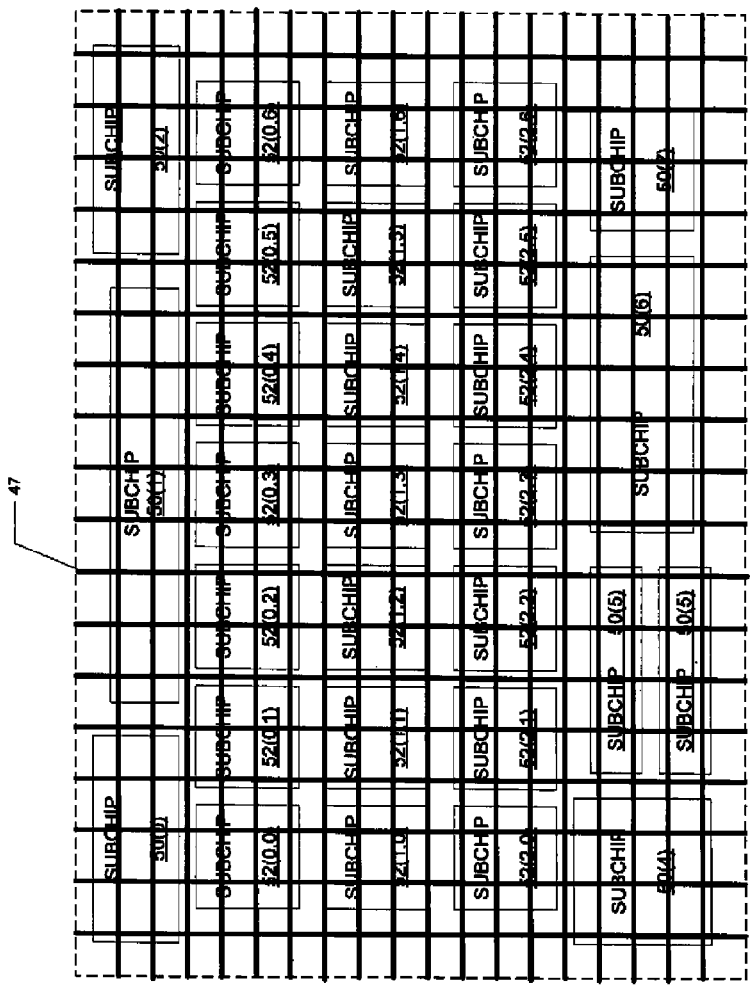

According to embodiments of this invention, and as is typical in the art, toplevel interconnections are routed according to wiring tracks, some extending in the "x" direction and others in the "y" direction. However, power supply and ground voltages must also be supplied to subchips 50, 52, and the toplevel interconnections necessarily must avoid the wiring for those power lines. FIG. 4b shows the placement of power mesh 47, as overlaid onto the arrangement of subchips 50, 52 of integrated circuit 45 shown in FIG. 4a. As known in the art, power mesh 47 refers to wiring tracks that are reserved in each conductor level for the routing of power supply and ground voltages to subchips 50 within integrated circuit 45. Typically, signal wiring is prohibited from being routed in those tracks of power mesh 47. In this example, the arrangement and placement of power mesh 47 is considered as an input to routing process 17 (and modification process 35), according to embodiments of the invention, such that the toplevel wiring must work around the tracks consumed by power mesh 47.

Figure 4C:
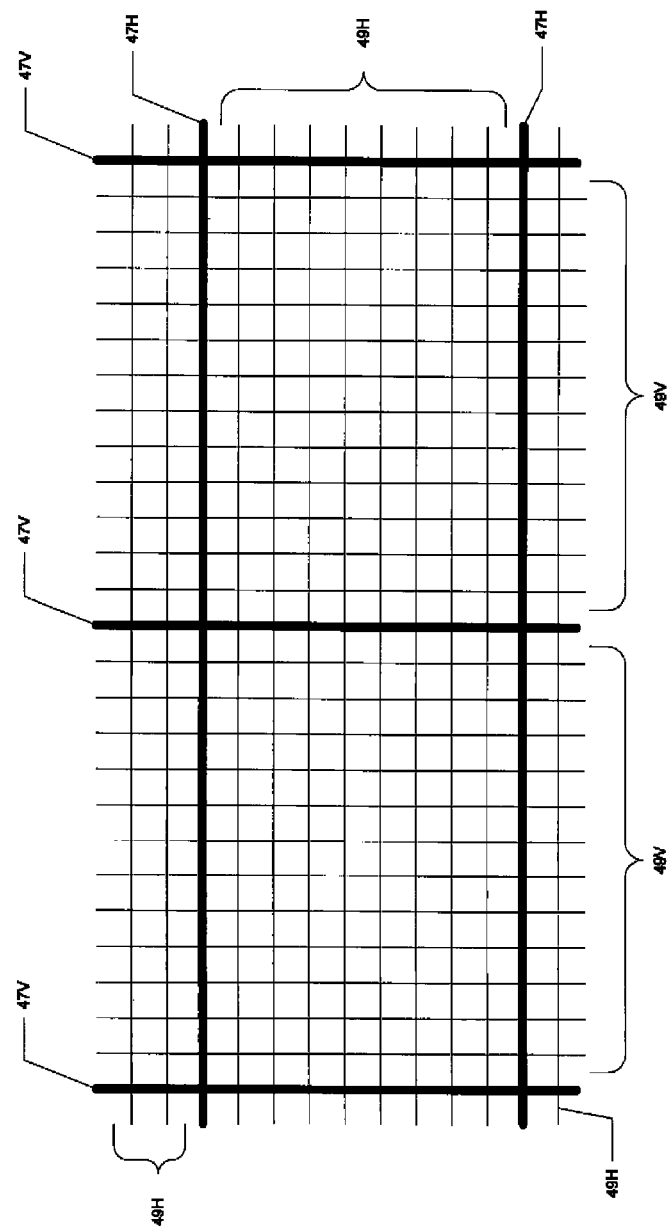

FIG. 4c illustrates a portion of integrated circuit 45 at which toplevel wiring tracks 49 have been defined to run between vertical power tracks 47V and horizontal power tracks 47H of power mesh 47. Wiring tracks 49V run in the vertical direction in the view of FIG. 4c, numbering twelve tracks 49V between adjacent vertical power tracks 47V in this example, and wiring tracks 49H run in the horizontal direction, numbering eight tracks 49H between adjacent horizontal power tracks 47H in this example. Each wiring track 49H, 49V refers to a straight line, in the horizontal or vertical direction, respectively, along which the centerline of a conductor of a specified pitch (relative to an adjacent conductor at that same "wire pitch") can be placed. In other words, separate isolated interconnections ("wires") may run along adjacent wiring tracks. The spacing of wiring tracks 49 may vary among the various conductor levels of the integrated circuit; the manufacturing specifications may specify different conductor materials to be used in the various layers, for example. The wire segments of toplevel interconnections, such as wire 60 of FIG. 4a, will run within these wiring tracks 49H, 49V, and thus avoid the power supply and ground wiring that may occupy power tracks 47H, 47V.

These toplevel interconnections may be initially routed by conventional manual routing, an autorouter system and software, or a combination of the two. Alternatively, such routing may be carried out according to my copending and commonly assigned U.S. application Ser. No. 13/297,086 entitled "An Interactive Routing Editor with Symbolic and Geometric Views for Integrated Circuit Layout", filed Nov. 15, 2011 and incorporated herein by reference, in which the user is allowed to define the routing of a toplevel bus using a "symbolic" view of a representative wire. Properties of the wires in that bus are defined by the user or system, and those properties allow for an automated building of the other wires in the toplevel bus from the routing of the representative wire. FIG. 4d illustrates an example of a completed representative wire 60[0], which in this case is the least significant bit (LSB) of a bus between a start node SN[LSB] at subchip 52(2,3) and a termination node TN[LSB] at subchip 50(4). The start and destination nodes refer to the order in which the various segments of wire 60[0] were routed, not necessarily an expected direction of signal propagation. In this example, wire 60[0] includes segment SEG(1) running horizontally between start node SN[LSB] and endpoint EP(1), segment SEG(2) running vertically (and thus in a different conductor level) from endpoint EP(1) to its endpoint EP(2), segment SEG(3) running horizontally between endpoint EP(2) to its endpoint EP(3), and so on until segment SEG(5) extends to termination node TN[LSB]. As described in the above-incorporated application Ser. No. 13/297,086, the location of horizontal segments SEG(1), SEG(3), SEG(5) are defined as the centerline of corresponding horizontal wiring tracks 49H in the grid of FIG. 4c; conversely, vertical segments SEG(2), SEG(4) are located at the centerline of corresponding vertical wiring tracks 49V. Horizontal tracks 49H at which horizontal segments SEG(1), SEG(3), SEG(5) are located serve to define the endpoints of vertical segments SEG(2), SEG(4), and vertical tracks 49V at which vertical segments SEG(2), SEG(4) are located serve to define the endpoints of horizontal segments SEG(1), SEG(3), SEG(5).

In this case, horizontal segments SEG(1), SEG(3), SEG(5) are in one metal level (e.g., metal level M2), and vertical segments SEG(2), SEG(4) are in a different metal level (e.g., metal level M3). As known in the art, a via is an eventual photomask location at which an opening in the intervening insulator layers will be made between the physical conductor representing the conductor levels involved in making the connection at that location. As will be mentioned below, system 20 will place vias between the conductor levels involved in the routing of selected bus 20, at the locations of the defined endpoints EP(1) through EP(4) between wire segments, between the metal conductor levels (e.g., metal levels M2, M3) corresponding to those wire segments.

As described in the above-incorporated application Ser. No. 13/297,086, certain wire and bus properties are assigned to the bus represented by representative wire 60[0], to allow the routing of the entire bus from the routing of that representative wire 60[0]. These properties include, for example, a "bit pitch", which is the distance, in wiring tracks, between the wires for adjacent bit positions in the bus; the wire pitch (i.e., physical pitch, or width plus spacing) of adjacent wires within the bus, expressed as a number of wiring tracks of minimum pitch for that particular conductor layer as specified in the applicable design rules; an LSB/MSB property that indicates whether the representative wire corresponds to the least significant bit or the most significant bit of its bus; and a directional property indicating whether the bus expands up or down, and left or right, from each segment of the representative wire.

Figure 4E:
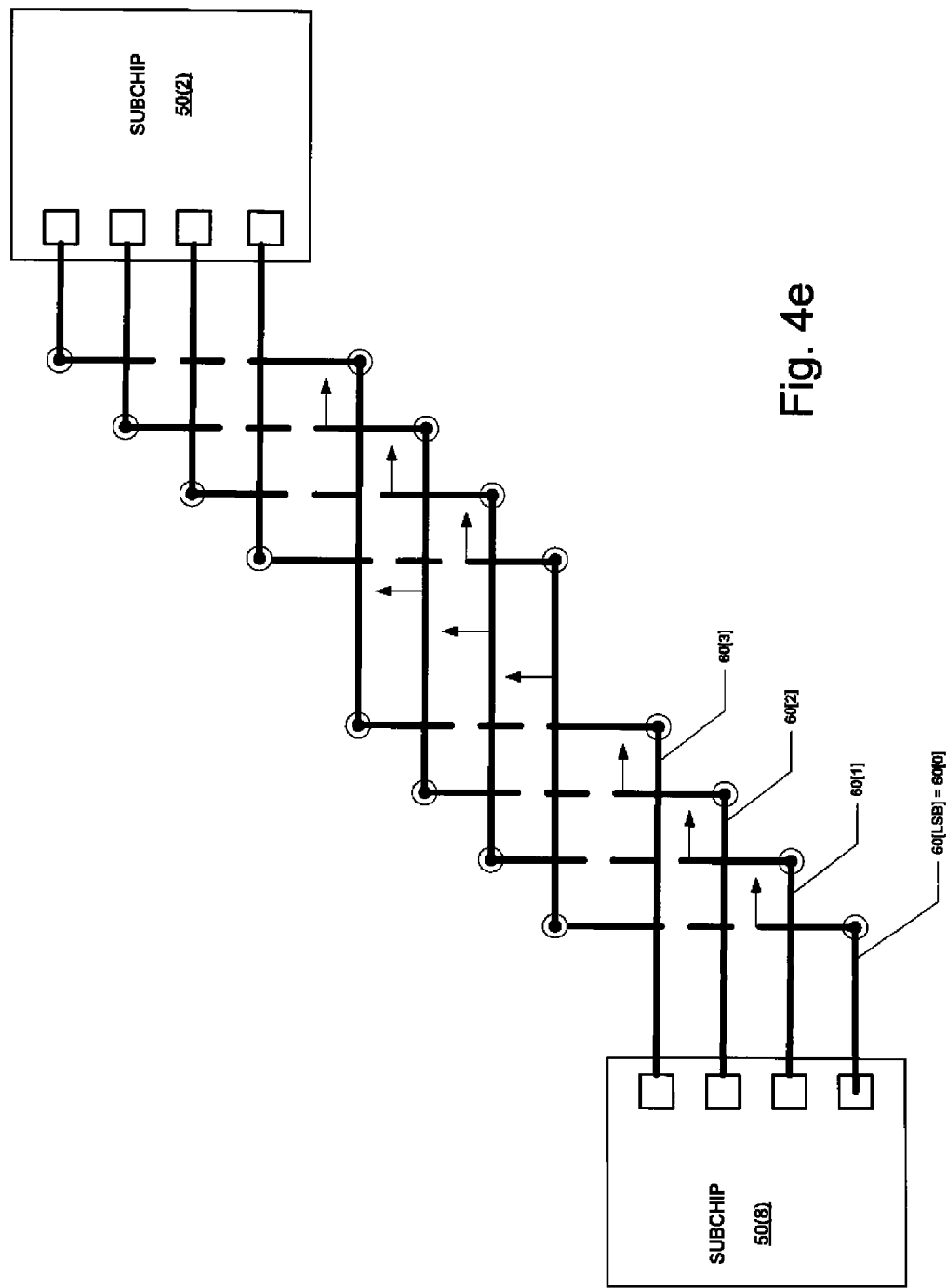

The LSB/MSB and directional bus properties are related in the sense that the values of these properties cooperate with one another in the expansion of bus 60. This relationship and effect of these properties is illustrated by way of a comparison of FIGS. 4c and 4d. As described in the above-incorporated application Ser. No. 13/297,086, FIG. 4d is the symbolic view of a bus by way of its representative wire 60[0]. FIG. 4e is the "geometric" view of bus 60 as constructed from that representative wire 60[0] and its associated properties, for the example in which the LSB/MSB property indicates that representative wire 60[0] is the "LSB" of bus 60, and in which the directional properties indicate expansion to the "right" and "up" from that representative wire 60[0].

Figure 5:
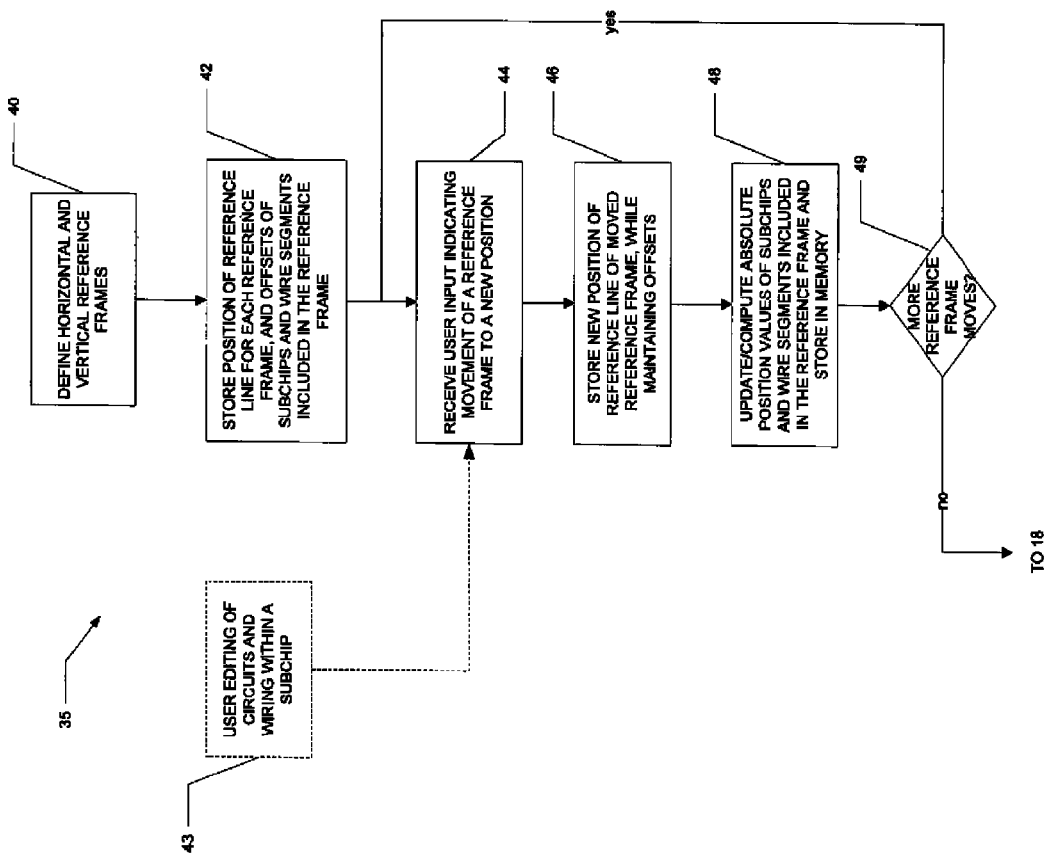
FIG. 5 is a flow diagram illustrating the operation of the system of FIG. 2 in modifying the layout of an integrated circuit, according to embodiments of the invention.

Referring now to FIG. 5, the operation of design and layout automation system 20 in carrying out modification process 35, according to embodiments of this invention, will now be described in detail. As described above relative to FIG. 2, it is contemplated that modification process 35 will be executed by one or more computing resources within design and layout automation system 20, as appropriate for the given system architecture and the nature of the particular computer program instructions implementing this process. It is contemplated that those skilled in the art having reference to this specification will be readily able to comprehend the manner in which process 35 is executed by the available and appropriate system implementation at hand, without undue experimentation.

As discussed above, at the point in the design and layout process (FIG. 3) at which modification process 35 is invoked, much of the layout of integrated circuit 45 has been completed, including the floorplanning of functional blocks (i.e., subchips 50, 52) within the boundary of integrated circuit 45, and also including, at least in part, routing of toplevel interconnections among those subchips 50, 52. As a predicate to the actual modification of the floorplan and routing, modification process 35 relies on the definition of horizontal and vertical reference frames in the layout, which is performed in process 40 by system 20, based on user input.

According to embodiments of this invention, a reference frame is a generally rectangular bounded region that encompasses one or more subchips and one or more wire segments within that region. More particularly, a reference frame according to these embodiments of the invention is associated with one of its axes (horizontal or vertical), and thus one of the axes of the integrated circuit in which it resides. Toplevel wire segments that extend in a direction parallel to the associated axis of the reference frame may also be associated with that reference frame. For example, a "horizontal" reference frame includes one or more subchips, and also toplevel wire segments within its boundaries that extend horizontally, but does not include wire segments within its boundaries that extend vertically. Conversely, a "vertical" reference frames includes one or more subchips, and also toplevel wire segments within its boundaries that extend vertically, but does not include wire segments within its boundaries that extend horizontally. According to embodiments of the invention, each wire segment will be included in one or more reference frames of a single orientation (i.e., horizontal or vertical), while each subchip will be included in reference frames of both orientations.

Figure 6A:
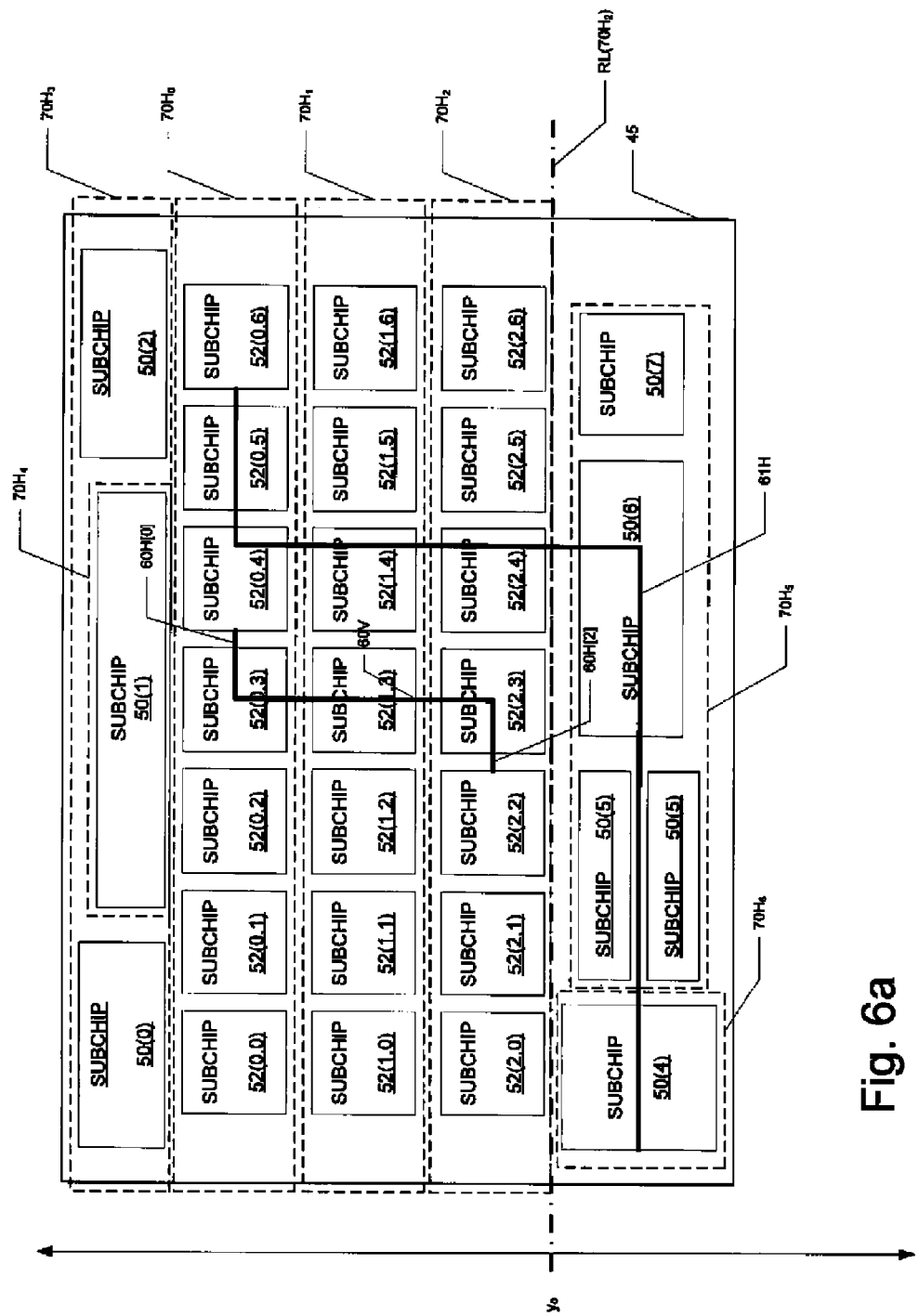
FIGS. 6a through 6e are plan views of an example of the layout of an integrated circuit, illustrating the assignment and movement of reference frames in that layout according to embodiments of the invention.

FIG. 6a illustrates an example of the arrangement of horizontal reference frames in integrated circuit 45 having the floorplan described above relative to FIG. 4a, as may be defined in process 40. In this example, horizontal reference frames $70H_o$ through $70H_6$ have been defined, each encompassing one or more of subchips 50, 52. For arrayed subchips $52(j,k)$ in this example, separate horizontal reference frames $70H_0$, $70H_1$, $70H_2$ are associated with subchips $52(0,k)$ in row 0, subchips $52(1,k)$ in row 1, and subchips $52(2,k)$ in row 2, respectively. Other horizontal reference frames $70H_3$ through $70H_6$ are assigned to subchips 50 on the sides of arrayed subchips $52(j,k)$.

Various properties of horizontal reference frames $70H_0$ through $70H_6$ are apparent from FIG. 6a. Horizontal reference frames $70H_0$, $70H_1$, $70H_2$ each extend across the entire width (x dimension) of integrated circuit 45, as does horizontal reference frame $70H_3$ encompassing subchips 50(0) through 50(2). On the other hand, horizontal reference frames $70H_4$ through $70H_6$ extend horizontally over only a portion of the width of integrated circuit 45. Horizontal reference frames $70H_4$ and $70H_6$ include only single subchips 50(1) and 50(4), respectively, while the others include multiple subchips 50, 52, as the case may be. Subchips 50, 52 may be included in multiple reference frames 70, as shown in FIG. 6a by subchip 50(1) being included both in reference frame $70H_3$ and also reference frame $70H_4$.

As mentioned above, reference frames 70 also include toplevel wire segments that extend in the same direction as the reference frame itself. In the example of FIG. 6a, horizontal wire segment 60H[0] is included in horizontal reference frame $70H_0$ and horizontal wire segment 70H[2] is included in horizontal reference frame $70H_2$. Vertical wire segment 60V connecting horizontal wire segments 60H[0] and 60H[2] is not associated with any horizontal reference frame 70H, as it is a vertical wire segment. As discussed above and in the above-incorporated application Ser. No. 13/297,086, the position of horizontal wire segments 60H[0] and 60H[2] define the endpoints of vertical wire segment 60V (and vice versa).

Some toplevel wire segments may extend across multiple reference frames, which can render reference frame assignment ambiguous. It is contemplated that a set of simple rules may be developed to consistently assign reference frames in those cases. An example of such a rule is to assign a wire segment that crosses multiple non-overlapping reference frames to that reference frame containing the greatest portion of its length. This situation is shown in FIG. 6a, for the case of horizontal wire segment 61H having portions in both of horizontal reference frames $70H_5$, $70H_6$, but is fully contained within neither; horizontal wire segment 61H would thus be assigned to reference frame $70H_5$ within which the majority of its length extends. Another rule may assign a wire segment that is fully contained within multiple reference frames to the shortest one of those reference frames (i.e., the reference frame over which the segment traverses the greatest fraction). Other rules may similarly be developed for other ambiguous situations, by those skilled in the art having reference to this specification.

In addition, according to embodiments of this invention, each subchip and toplevel wire segment is required to reside within at least one horizontal reference frame (and one vertical reference frame, as will be described below). As such, it is contemplated that horizontal reference frames 70 will cover essentially the entirety of integrated circuit 45. Gaps between horizontal reference frames 70H (shown in FIG. 6a for clarity) are permitted if no subchip or horizontal wire segments reside in those gaps. A default horizontal reference frame may be defined to include the entirety of the chip area of integrated circuit 45, to ensure that no element remains outside of a horizontal reference frame; conversely, the default condition for an element that is otherwise outside of a reference frame in a particular orientation (e.g., horizontal) would be to create a reference frame in that orientation for that element alone.

According to embodiments of this invention, the location of each horizontal reference frame in the vertical direction is specified by a horizontal reference line. FIG. 6a illustrates an example of such a horizontal reference line, by way of horizontal reference line $RL(70H_2)$ that specifies the vertical position ($y_0$) of horizontal reference frame $70H_2$. According to embodiments of this invention, the locations of components (i.e., subchips and wire segments) associated with that horizontal reference frame 70H are specified relative to the position of that reference line. The relationship of those subchips and horizontal wire segments associated with a given horizontal reference frame to this horizontal reference line will be described in further detail below.

Figure 6B:
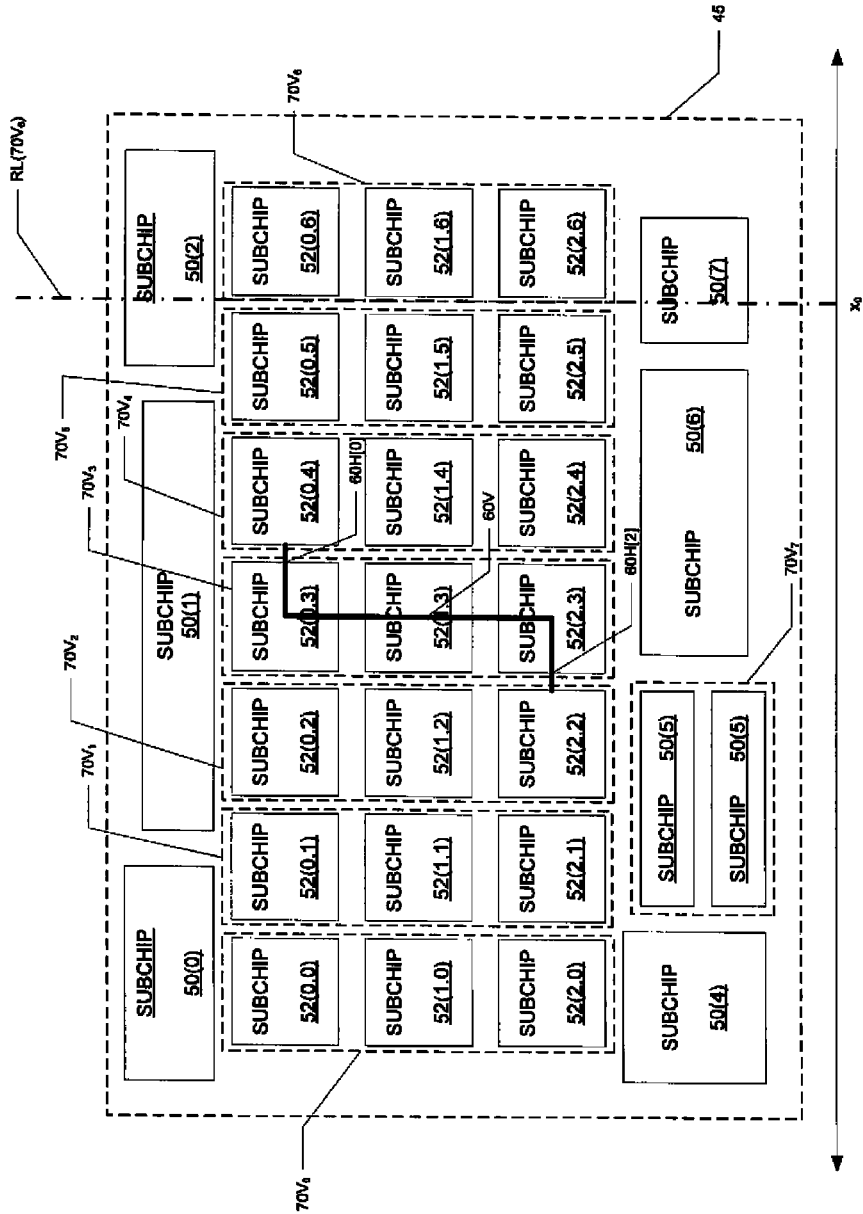

As mentioned above, according to embodiments of this invention, both horizontal and vertical reference frames are defined within the layout of integrated circuit 45. FIG. 6b illustrates an example of the arrangement of the vertical reference frames in integrated circuit 45 having the floorplan described above relative to FIG. 4a. These vertical reference frames will also be defined in process 40. In this example, vertical reference frames $70V_0$ through $70V_6$ have been defined for arrayed subchips $52(j,k)$, by column. More specifically, vertical reference frame $70V_0$ is associated with subchips $52(j,0)$ in column 0, vertical reference frame $70V_1$ is associated with subchips $52(j,1)$ in column 1, vertical reference frame $70V_2$ is associated with subchips $52(j,2)$ in column 2, and so on. Each of subchips 50(0) through 50(7) will also be associated with one or more vertical reference frames. For example, vertical reference frame $70V_7$ is assigned to subchips 50(5) along the bottom of arrayed subchips $52(j,k)$. Other vertical reference frames assigned to the other subchips 50 along the sides of arrayed subchips $52(j,k)$ are not shown for the sake of clarity; it is to be understood, however, that every subchip 50, 52 and every toplevel wire segment in the layout of integrated circuit 45 ought to be associated with at least one vertical reference frame.

Figure 6C:
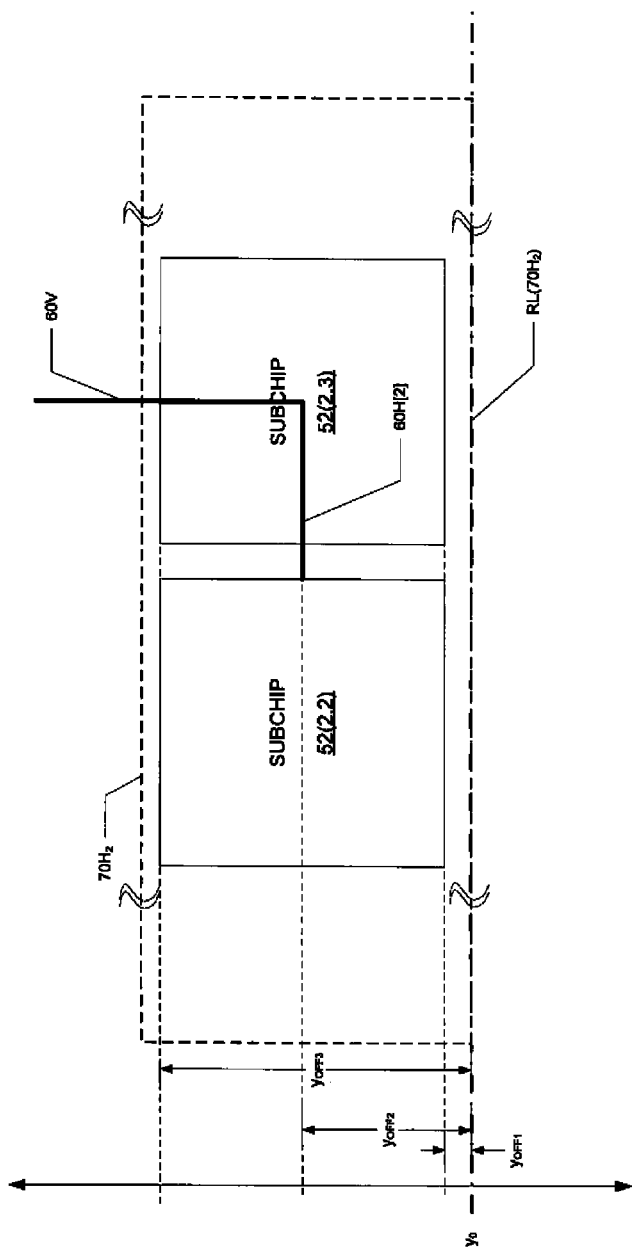
Figure 6D:
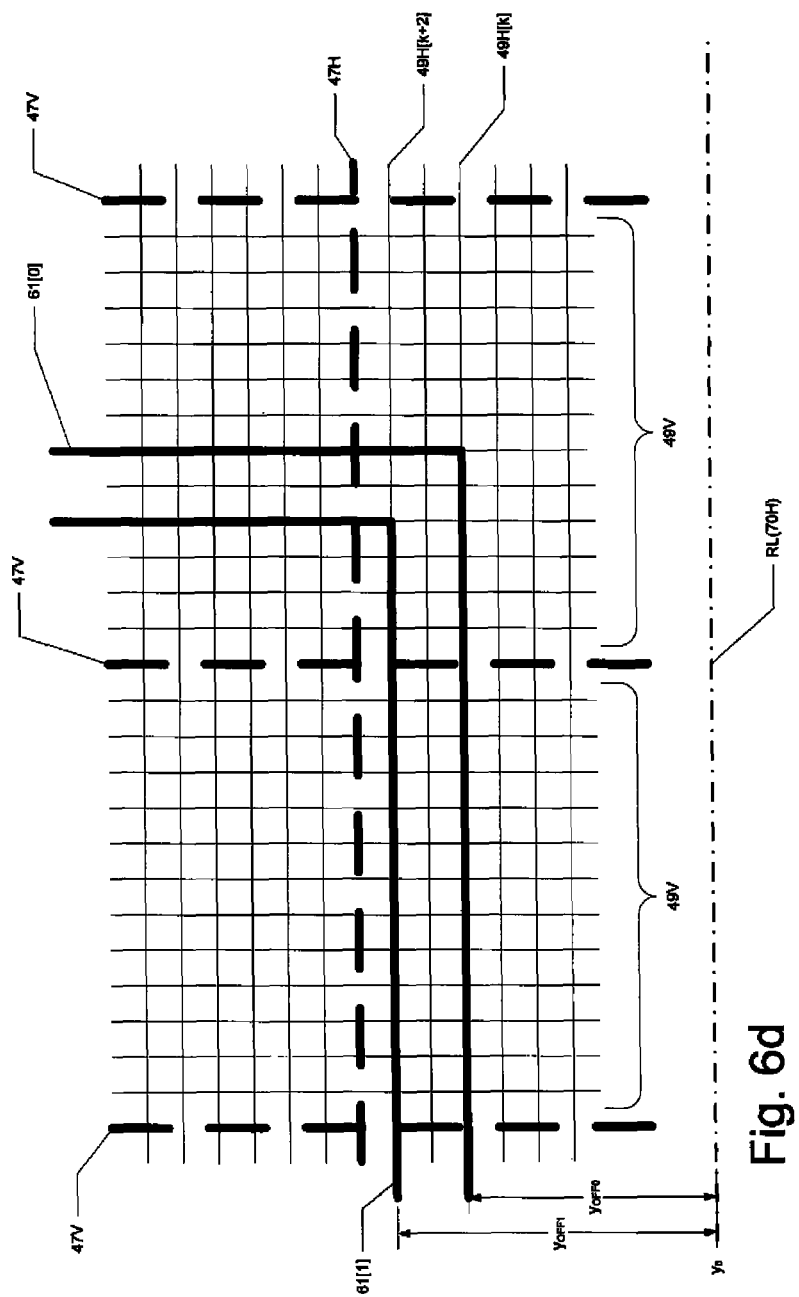
Figure 6E:
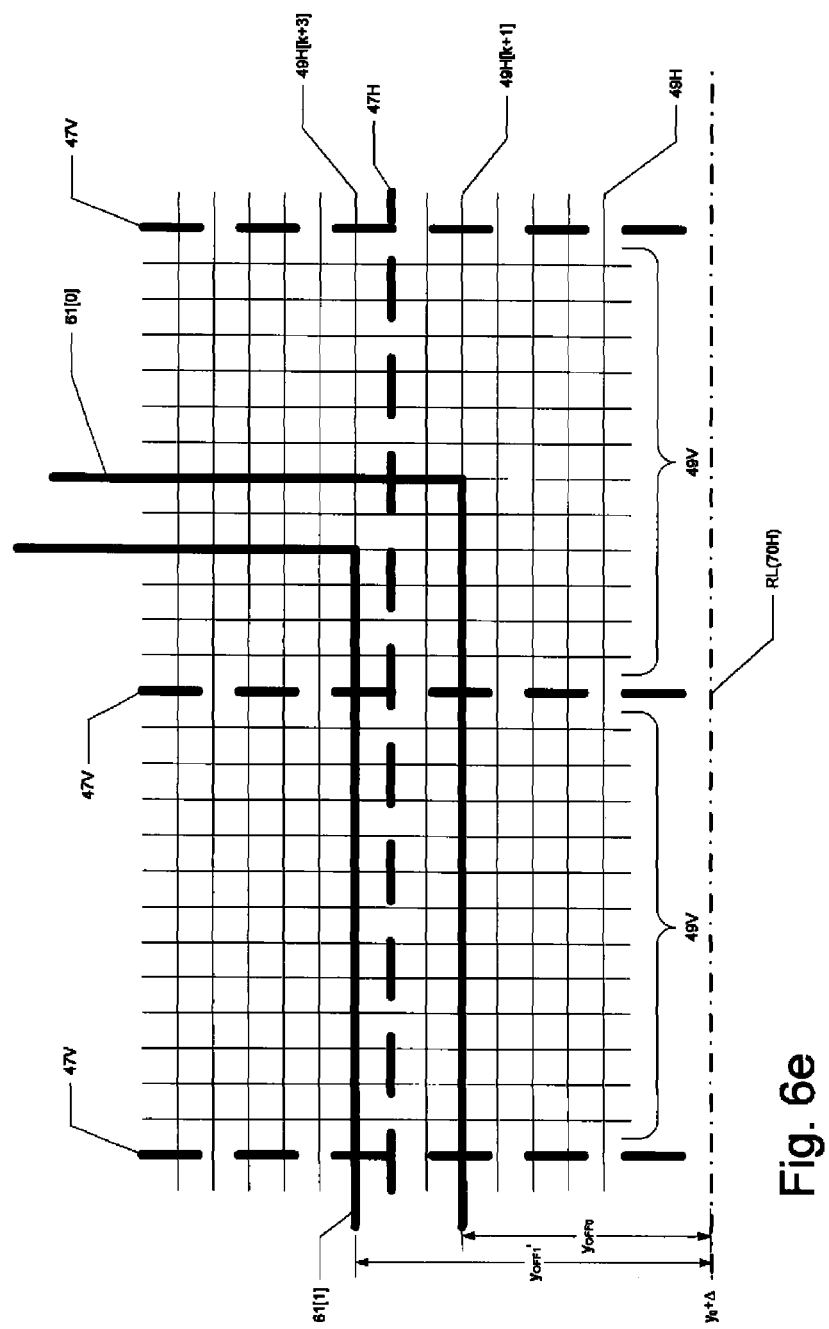

The properties of vertical reference frames 70V are similar to those available for horizontal reference frames $70H_0$ through $70H_6$ described above. Vertical reference frames 70V may either extend across the entire height (in the y dimension) of integrated circuit 45, or may vertically extend over only a portion of that height. A given vertical reference frame 70V may include only a single subchip 50, 52, or may include multiple subchips as shown in FIG. 6e. Individual subchips 50, 52 may be associated with multiple vertical reference frames 70V, or may reside only in a single vertical reference frame 70V. If necessary, a default vertical reference frame 70V may be defined to encompass the entire area of integrated circuit 45, to ensure that every subchip 50, 52 and every toplevel wire segment is associated with at least one vertical reference frame.

As mentioned above, reference frames 70 also include those toplevel wire segments that extend in the same direction as the reference frame itself. This property is illustrated in FIG. 6b by vertical wire segment 60V, which is associated with vertical reference frame $70V_3$. As mentioned above and according to the approach described in the above-incorporated application Ser. No. 13/297,086, the position of vertical wire segment 60V defines the endpoints of horizontal wire segments 60H[0] and 60H[2].

As described above, those toplevel vertical wire segments that extend across multiple vertical reference frames are preferably assigned to one vertical reference frame according to a set of simple rules, to avoid ambiguity. The examples of rules including assignment of a wire segment that crosses multiple non-overlapping reference frames to that reference frame containing the greatest portion of its length, and assignment of a wire segment that is fully contained within multiple reference frames to the shortest one of those reference frames (i.e., the reference frame over which the segment traverses the greatest fraction), and the like, also apply to the assignment of vertical wire segments to vertical reference frames.

According to embodiments of this invention, and similarly to that described above for horizontal reference frames, each vertical reference frame 70V is associated with a vertical reference line that specifies the location of the vertical reference frame 70V in the horizontal direction. FIG. 6b illustrates an example of such a vertical reference line, by way of vertical reference line $RL(70V_6)$ that specifies the horizontal position ($x_0$) of vertical reference frame $70V_6$.

In the operation of modification process 35 summarized in FIG. 5, process 42 is performed by system 20 to store, in system memory, the positions of the reference lines associated with each of the horizontal and vertical reference frames defined in process 40, and also the position of components (i.e., subchips and toplevel wire segments) associated with each reference frame relative to those reference lines. FIGS. 6c through 6e illustrate, by way of example, the relationship of these elements of each reference frame.

FIG. 6c illustrates an example of this specification of the locations of reference frames and their associated components in reference frame definition process 40 according to embodiments of the invention, for the case of horizontal reference frame $70H_2$ from integrated circuit 45 of FIG. 6a. In the view of FIG. 6c, reference line $RL(70H_2)$ is defined at the lower bound of reference frame $70H_2$, and will specify the position of reference frame $70H_2$ in the orthogonal (vertical, or "y") direction. In this case, reference line $RL(70H_2)$ is at vertical position $y_0$, which is a specific absolute position along the y-axis within the boundaries of integrated circuit 45 (see also FIG. 6a for vertical position $y_0$). The vertical positions of components within reference frame $70H_2$ are specified by offset values relative to vertical position $y_o$ of reference line $RL(70H_2)$. In the example of FIG. 6c, the bottom edges of subchips 52(2,2) and 52(2,3) are both at a vertical offset $y_{OFF1}$ relative to vertical position $y_0$ of reference line $RL(70H_2)$. The example of FIG. 6c shows the bottom edges of subchips 52(2,2) and 52(2,3) as collinear with one another at this offset $y_{OFF1}$; if these bottom edges were not collinear, subchips 52(2,2) and 52(2,3) would be assigned different offset values for their respective bottom edges. Similarly, the top edges of subchips 52(2,2) and 52(2,3) are both at a vertical offset $y_{OFF3}$ relative to vertical position $y_0$ of reference line $RL(70H_2)$, in this example; again, if these top edges were at different vertical positions, each would have its own offset value. An offset value is also assigned to each horizontally-running toplevel wire segment within an associated reference frame. In the example of FIG. 6c, the vertical position of horizontal wire segment 60H[2] has an offset value $y_{OFF2}$ as shown. Vertical wire segments, such as vertical segment 60V, are not associated with a horizontal reference frame according to embodiments of this invention, as they do not have a specific vertical position.

More specifically, as shown by way of example in FIGS. 6d and 6e, the offset values associated with reference frames are specified in terms of available (i.e., not occupied by power or ground conductors) wiring tracks, according to embodiments of this invention. In the example shown in FIG. 6d, horizontal power track 47H is disposed among horizontal signal tracks 49H; vertical power tracks 47V are similarly disposed among vertical signal tracks 49V, both as described above relative to FIG. 4c. In this example, toplevel wires 61[0], 61[1] are illustrated, horizontal segments of which are associated with a horizontal reference frame 70H. A horizontal segment of wire 61[0] has been routed to horizontal wiring track 49H[k], at an offset $y_{OFF0}$ from reference line RL(70H), and a horizontal segment of wire 61[1] has been routed to horizontal wiring track 49H[k+2], at an offset $y_{OFF1}$ from reference line RL(70H). According to the system and method of the above-incorporated application Ser. No. 13/297,086, this spacing represents a bit pitch of two in the bus that includes these wires 61[0], 61[1]. In this case, the position of wire segment 61[0] in reference frame 70H may be stored in memory using its offset value $y_{OFF0}$, but the position of wire segment 61[1] need not be explicitly stored, as its position can be derived using the bit pitch.

FIG. 6e illustrates the routing of wires 61[0], 61[1] after an adjustment Δ in the vertical position of the horizontal reference frame 70H including the horizontal wire segments of wires 61[0], 61[1] shown in FIG. 6d. In this example, the adjustment D amounts to the physical distance of a single horizontal wiring track 49H. This adjustment is reflected in a new vertical position $y_o + \Delta$ of reference line RL(70H). As described above, however, the offset values $y_{OFF}$ of the horizontal wire segments within this horizontal reference frame 70H are specified by a number of available wiring tracks. In this example, the adjustment of the vertical position of reference line RL(70H) shifts the vertical position of the horizontal wire segments of wires 61[0], 61[1]. To maintain the same offset values $y_{OFF0}$, $y_{OFF1}$, the horizontal wire segments of wires 61[0], 61[1] are each shifted up to by one available wiring track, to wiring tracks 49H[k+1] and 49H[k+3], respectively. From a physical standpoint (i.e., absolute position), however, because of the location of horizontal power track 47H, the physical offset distance $y_{OFF1}'$ of the horizontal segment of wire 61[1] from reference line RL(70H) in FIG. 6e is greater than the physical offset distance $y_{OFF1}$ prior to the adjustment, as shown in FIG. 6d. It is contemplated that system 20 will be readily capable of maintaining such routing information, by available wiring track, in accounting for adjustments and changes in position of reference frames in this manner. Indeed, it is contemplated that the use of available wiring tracks will facilitate such adjustment in the location of previously routed wire segments by system 20, as it automatically ensures the proper spacing and routing grid behavior following such adjustment.

The operation of storing process 42 shown in FIGS. 6c through 6e for the case of horizontal reference frames is similarly carried out to define and store the horizontal positions of subchip edges and vertical wire segments with corresponding associated vertical reference frames that were defined in process 40. Of course, for vertical reference frames 70V, the absolute position $(x_0)$ of reference lines RL(70V) and offset values of subchip edges and vertical wire segments within each vertical reference frame are in the horizontal (x) dimension. Similarly as described above relative to FIGS. 6d and 6e, it is contemplated that these offset values will be specified as numbers of available vertical wiring tracks, at least for vertical wire segments within the vertical reference frame 70V.

According to embodiments of this invention, therefore, reference frame definition process 40 and storing process 42 produce data that specify the placement origin location of each subchip 50, 52 of integrated circuit 45, in both the horizontal and vertical dimensions, and also the location of each wire segment along its orthogonal direction. These locations are specified as offset values relative to reference lines defining the location of the defined reference frames, in both the horizontal and vertical directions. The position of each subchip 50, 52 in the layout is stored in memory by way of a single x-y placement origin location, typically in combination with a transform view that specifies various options such as mirroring (left or right mirror image) and rotation (0°, ±90°, 180°) of the subchip in the layout. Locations of elements within each subchip 50, 52 can be derived from the specified placement origin and transform view, in combination with and dimensions and sizes internal to that subchip 50, 52. This approach facilitates editing of the position of these components in the design process, including after the routing of some or all of the toplevel wiring. For example, adjustment or movement of the vertical position of components associated with a given horizontal reference frame requires only an updating of the vertical position (e.g., $y_0$) of the horizontal reference line for that horizontal reference frame. The vertical offset values of each component associated with the moved horizontal reference frame do not change. Similarly, the horizontal adjustment or movement of the position of components associated with a given vertical reference frame requires only an updating of the horizontal position (e.g., $x_0$) of the vertical reference line for that vertical reference frame, and the offset values of each component associated with the moved vertical reference frame do not change. As a result, the effort required in modification process 35 to not only move subchips but also re-route toplevel wiring paths is greatly reduced from that necessary according to conventional layout systems and tools.

It is contemplated that reference frame definition process 40 and the storing of the resulting reference lines and offset values in process 42 may result from floorplanning process 13, placement process 14, and routing process 17 in the initial physical realization 16 of integrated circuit 45, for example if design and layout automation system 20 is itself used for these processes. Alternatively, if the layout of integrated circuit 45 is read into design and layout automation system 20 from an existing database, only the absolute positions (x,y coordinates) of subchips 50, 52, and toplevel wiring may be available at the time that modification process 35 is invoked by the user. In that case, reference frame definition and storing processes 40, 42 will be performed prior to the actual editing of the layout. In that case, reference frames may be defined interactively by the layout engineer, with the reference line positions and offset values computed from the absolute positions of the existing database representation. It is contemplated that those skilled in the art having reference to this specification can readily implement such conversion of these representations as necessary for carrying out an embodiment of this invention, without undue experimentation.

Referring again to FIG. 5, process 44 is next performed by system 20 to receive user inputs indicating that one of the reference frames defined in process 40 is to be moved. This movement is often the result of, or necessitated by, the user editing of circuits and wiring within one or more of subchips 50, 52, as shown by optional process 43. For example, the editing of circuits and wiring within a subchip 50, 52 may result in an increase (or, less often, a decrease) in the chip area required for that subchip. Such changes in subchip area occurring after the processes of floorplanning 13, placement 15, and routing 17 (FIG. 3) generally results in the need to move the location of other subchips 50, 52 and modification of the toplevel wiring, as will be reflected by a "yes" result for decision 33. In process 44, system 20 receives the user inputs indicating the desired movement of a reference frame, either as the vertical movement of a horizontal reference frame 70H, or the horizontal movement of a vertical reference frame 70V. It is contemplated that these user inputs will be provided to system 20 by way of a graphical user interface, for example by way of the user selecting one of reference frames 70 and then moving the selected reference frame 70 (i.e., by a "click-and-drag" motion) to a new position in the direction orthogonal to the reference frame (i.e., a new vertical position for a horizontal reference frame 70H, or a new horizontal position for a vertical reference frame 70V).

Figure 7A:
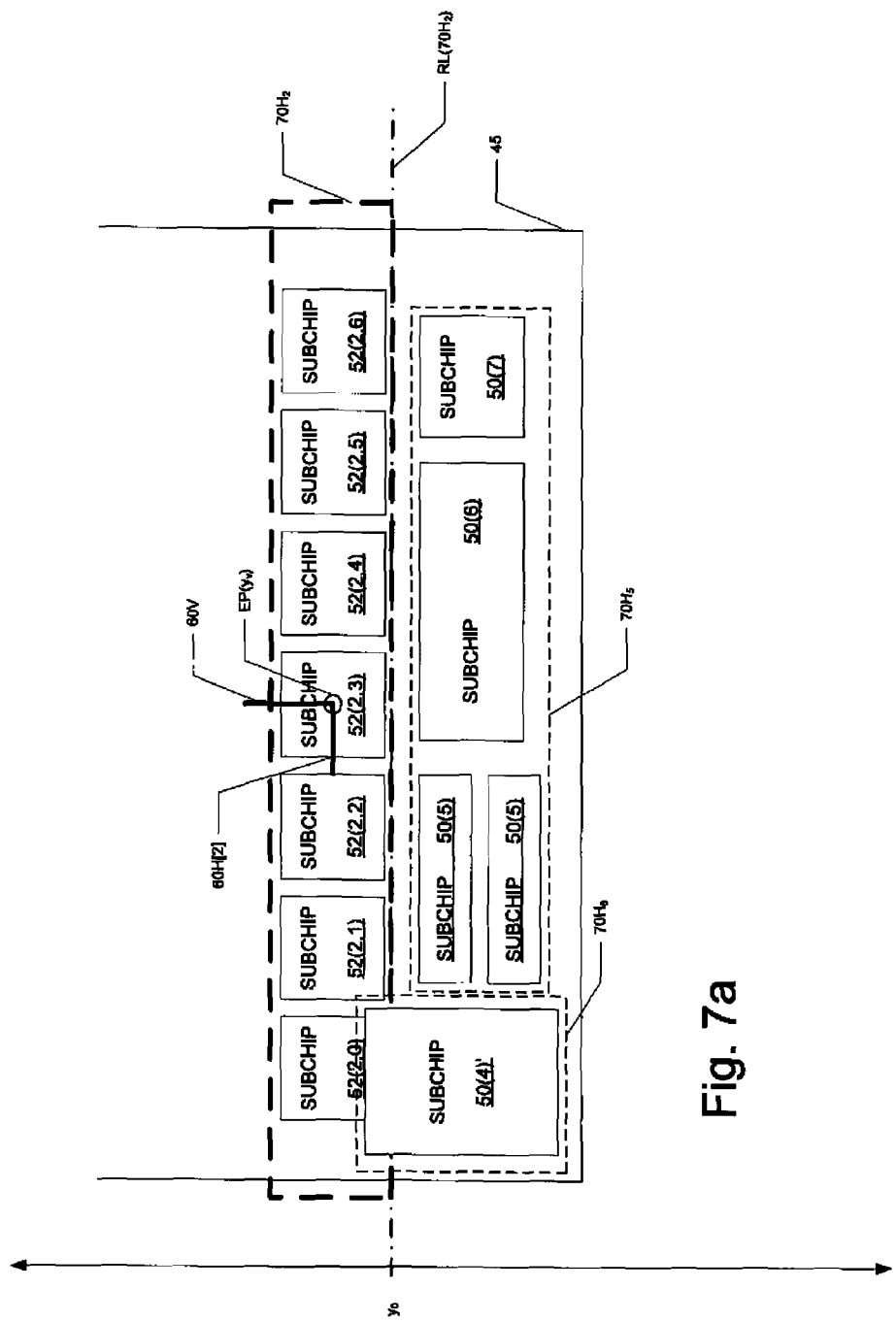
FIGS. 7a and 7b are plan views illustrating an example of the moving of a reference frame according to the method of FIG. 5, and according to embodiments of the invention.
Figure 7B:
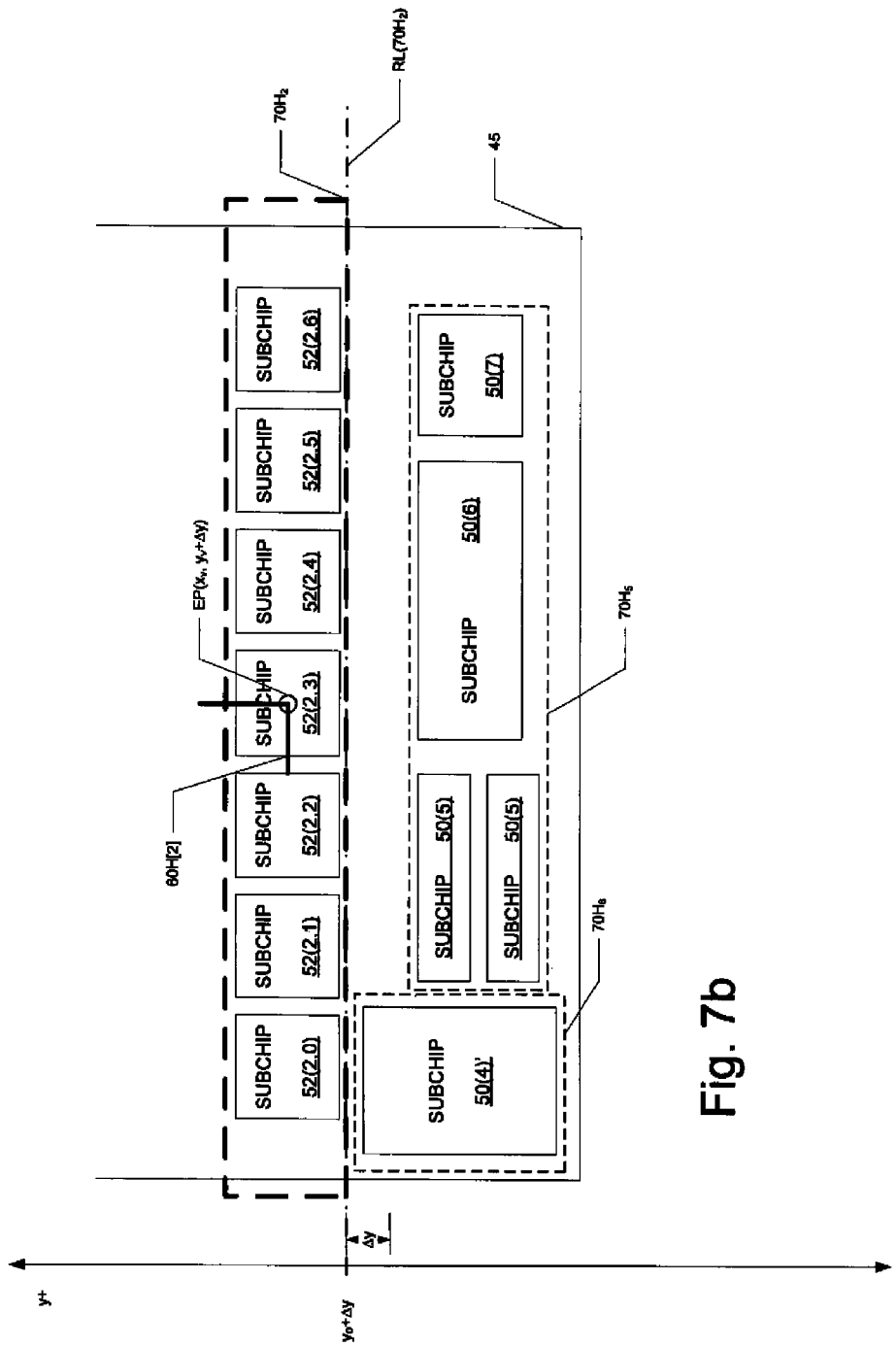

FIGS. 7a and 7b illustrate an example of the movement of horizontal reference frame $70H_2$, by way of a user input received in process 44. In this example, optional subchip editing process 43 has been applied to subchip 50(4) of FIG. 6a, resulting in a larger size for that subchip as illustrated in FIG. 7a by way of subchip 50(4)'. Horizontal reference frame $70H_6$ is necessarily enlarged as a result of that editing of subchip 50(4)'. As evident from FIG. 7a, the increased size of modified subchip 50(4)' overlaps the placement of subchip 52(2,0), requiring row 2 of arrayed subchips 50 to be moved upwardly to accommodate the larger subchip 50(4)'. As shown in FIG. 7a, reference frame $70H_2$ has been selected by the user in process 44, for movement to a new vertical position.

FIG. 7b illustrates the position of horizontal reference frame $70H_2$ and those subchips 52(2,k) and horizontal wire segment 60H[2] after its movement in process 44 by a sufficient vertical distance+$\Delta y$ to accommodate the larger size of subchip 50(4)'. The new vertical position $y_0+\Delta y$ of reference line $RL(70H_2)$ of horizontal reference frame $70H_2$ is then stored by system 20 in the appropriate memory resource, in process 46. As shown in FIG. 7b, reference line $RL(70H_2)$ is now at a new vertical position $y_0+\Delta y$, which is moved upward (in the +y direction) relative to its original position $y_0$ shown in FIG. 7a. According to embodiments of this invention, as described above relative to FIGS. 6c through 6e, the offset values specifying the vertical position of edges of subchips 52(2,k) and horizontal wire segment 60H[2] associated with horizontal reference frame $70H_2$ are not changed by this movement of horizontal reference frame $70H_2$. Rather, only the absolute vertical position of reference line $RL(70H_2)$ changes, from $y_0$ to $y_0+\Delta y$, with the offset values $y_{OFF}$ (FIGS. 6c through 6e) remaining constant during the move. And, as described above relative to FIGS. 6d and 6e, the offset value specifying the vertical position of horizontal wire segment 60H[2] will be expressed in terms of available horizontal wiring tracks, taking into account the position of those wiring tracks reserved for power and ground voltages.

As described above, the vertical position of horizontal toplevel wire segments such as segment 60H[2] defines the vertical position of the endpoint of vertical wire segments to which those horizontal segments are connected. An example of such an endpoint is illustrated in FIG. 7a by endpoint $EP(y_v)$ of vertical wire segment 60V to which horizontal wire segment 60H[2] is connected. Similarly, the horizontal position of vertical wire segment 60V defines the horizontal position of the endpoint of horizontal wire segment 60H[2]. And because these horizontal and vertical wire segments are in different metal levels, as described above, the design database will specify the location of this endpoint as the location of a via. As reference frame $70H_2$ containing horizontal wire segment 60H[2] is moved by the distance+$\Delta y$ to the location shown in FIG. 7b, the vertical position of the endpoint of vertical wire segment 60V (and thus the corresponding location of the via between the two metal levels) will also move, as shown by endpoint $EP(y_v+\Delta y)$ in FIG. 7b.

According to embodiments of this invention, system 20 can then next execute process 48 to compute or update new absolute positions of the subchip edges and toplevel horizontal wire segments associated with the horizontal reference frame that was moved in processes 44, 46. For the example of FIGS. 7a and 7b, these updated absolute positions are computed from the maintained original offset values $y_{OFF}$ (as may be expressed as a number of available wiring tracks) and the new vertical position $y_0+\Delta y$ of reference line $RL(70H_2)$ for the moved horizontal reference frame $70H_2$.

While not shown in FIGS. 7a and 7b, the movement of reference frame $70H_2$ may cause its subchips 52(2,k) and other components to now overlap onto components in a neighboring horizontal reference frame $70H_1$ within integrated circuit 45, in the example of FIG. 6a. This will, in turn, require the editing and movement of that neighboring reference frame $70H_1$ to eliminate the overlap. In this regard, system 20 executes decision 49 to determine whether other reference frames are to be moved, either due to an overlap situation such as described above or because additional editing of the layout is desired by the user. If so (decision 49 is "yes"), control returns to process 44 to receive a user input corresponding to that next reference frame move.

The order in which reference frames and their associated components are moved or their positions otherwise adjusted in modification process 35 is, of course, left to the discretion of the user. For example, referring to the example of FIGS. 7a and 7b, the user may have previously moved neighboring horizontal reference frame $70H_1$ in order to provide sufficient space for the upward adjustment of the position of horizontal reference frame 70H₂, in which case no further reference frame movement is necessary (decision 49 is "no").

Further in the alternative, the position of a particular subchip 50, 52 can be quite drastically changed by way of modification process 35. For example, the horizontal reference frame 70H to which a subchip 50, 52 belongs may first be moved to a different vertical position, followed by horizontal movement of the vertical reference frame 70V to which that particular subchip 50, 52 belongs. Such wholesale movement may involve several corresponding reference frame moves, in both the horizontal and vertical directions, in order to essentially re-layout the arrangement of integrated circuit 45. However, even with such wholesale changes, it is contemplated that embodiments of this invention will reduce the time and tedious effort required to move each of the component subchips 50, 52 in the layout and to re-route the toplevel wiring of integrated circuit 45.

Upon completion of all reference frame moves (decision 49 is "no"), modification process 35 ends. Physical implementation process 16 (FIG. 3) is then complete, allowing the modified layout and routing of integrated circuit 45 to pass to manufacturing process 18, in which photomasks corresponding to the completed design and layout are created, followed by the fabrication of actual integrated circuits based on that design and layout.

Embodiments of this invention provide several important advantages in the design and layout of integrated circuits, particularly complex integrated circuits of the ASIC type, and involving many top-level interconnects among multiple subchips within the integrated circuit. As described above, this invention enables the human design engineer to edit the floorplan of a very-large-scale integrated circuit, even after toplevel wiring has been partially or completely routed, in a highly efficient manner. Manual movement of individual components, and especially manual re-routing of the toplevel wiring, can be largely avoided.

While this invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of defining the physical layout of functional blocks and one or more interconnections in an integrated circuit, comprising the steps of:
arranging the layout of functional blocks in a rectangular portion of a physical layout of an integrated circuit using a computer;
routing a plurality of interconnections among the functional blocks in the physical layout, each of the plurality of interconnections comprising a plurality of orthogonal wire segments, each wire segment extending parallel to a side of the rectangular portion using a computer;
assigning a first reference frame extending in a first direction parallel to a side of the rectangular portion, and with which one or more functional blocks and one or more wire segments extending in the first direction within the first reference frame are associated, the first reference frame having a reference line at a specified position in a second direction perpendicular to the first direction, and the position of each of the functional blocks and wire segments associated with the first reference frame specified by respective offset values relative to the reference line using a computer; and
after the routing and assigning steps, responsive to receiving a user input indicating a desired movement of the first reference frame in the second direction, adjusting the specified position of the reference line while maintaining constant the offset values of the functional blocks and wire segments associated with the first reference frame using a computer.

2. The method of claim 1, further comprising:
storing, in memory of a computer system, absolute position values, in the physical layout, of the functional blocks and wire segments associated with the first reference frame using a computer;
after the adjusting step, recalculating the absolute position values of the functional blocks and wire segments associated with the first reference frame using a computer; and
storing the recalculated absolute position values in memory using a computer.

3. The method of claim 1, wherein the positions of a plurality of the wire segments associated with the first reference frame define endpoints of wire segments extending in the second direction to which the wire segments associated with the first reference frame are connected.

4. The method of claim 3, wherein the adjusting step further comprises:
adjusting the endpoints of wire segments extending in the second direction to which the wire segments associated with the first reference frame are connected using a computer.

5. The method of claim 4, wherein the routing step further comprises:
defining the locations of vias between metal conductors in different metal levels of the integrated circuit at the endpoints of wire segments extending in the second direction to which the wire segments associated with the first reference frame are connected using a computer;
and wherein the adjusting step further comprises:
moving the locations of the vias using a computer.

6. The method of claim 1, wherein the offset values correspond to numbers of available wiring tracks extending in the first direction, at pluralities of positions in the rectangular portion along the second direction.

7. The method of claim 1, wherein the first reference frame extends in the first direction across the entirety of the rectangular portion.

8. The method of claim 1, wherein the first reference frame extends in the first direction for only part of the rectangular portion.

9. The method of claim 1, further comprising:
assigning a second reference frame extending in the second direction, and with which one or more functional blocks and one or more wire segments extending in the second direction within the second reference frame are associated, the second reference frame having a reference line at a specified position in the first direction, and the position of each of the functional blocks and wire segments associated with the second reference frame specified by respective offset values relative to the reference line using a computer; and
after the routing and assigning steps, responsive to receiving a user input indicating a desired movement of the second reference frame in the first direction, adjusting the specified position of the reference line while maintaining constant the offset values of the functional blocks and wire segments associated with the second reference frame using a computer.

10. The method of claim 9, wherein each functional block is associated with at least one reference frame extending in the first direction and at least one reference frame extending in the second direction.

11. The method of claim 10, wherein each interconnection wire segment in the rectangular portion is associated with either one or more reference frames extending in the first direction or one or more reference frames extending in the second direction.

12. The method of claim 1, wherein the routing step comprises:
identifying a plurality of interconnections between nodes of first and second functional blocks in the physical layout as a first bus comprised of a plurality of wires using a computer;
receiving drawing inputs from a user corresponding to physical routing of a representative wire in the first bus;
displaying the physical routing of the representative wire at a graphics display of a computer system;
storing, in a memory of the computer system, routing data comprising the location of each of one or more segments of the representative wire in the integrated circuit layout, and property data, for each segment, comprising a plurality of properties corresponding to the physical arrangement of the plurality of wires in the first bus using a computer;
deriving routing data comprising the physical routing of one or more segments of each of a plurality of wires in the first bus in the integrated circuit layout, from the routing data and the associated property data of the representative wire using a computer; and
then displaying, at the graphics display, the physical routing of the plurality of wires in the first bus.

13. The method of claim 1, wherein the plurality of properties comprise one or more of:
a wire pitch indicating a physical width of the representative wire;
a bit pitch indicating a spacing between adjacent wires in the bus, expressed as a number of wiring tracks at the wire pitch;
a bus position property indicating whether the representative wire is a least significant bit or a most significant bit of the first bus; and
expansion direction properties comprising:
for a first wire segment, a first expansion direction property indicating the direction, in a first direction, in which additional wires in the first bus are disposed relative to the representative wire; and
for a second wire segment, a second expansion direction property indicating the direction, in a second direction, in which additional wires in the first bus are disposed relative to the representative wire.

14. A computer system for interactively modifying a layout of an integrated circuit, the layout including functional blocks arranged in a rectangular portion and including a plurality of interconnections among the functional blocks, each interconnection comprised of a plurality of orthogonal wire segments that each extend parallel to a side of the rectangular portion, the system comprising:
an input device for receiving inputs from a system user;
a graphics display;
a processor; and
memory resources, coupled to the processor, including program memory for storing a computer program including program instructions that, when executed by the processor, perform a plurality of operations comprising:
assigning a first reference frame extending in a first direction parallel to a side of the rectangular portion, and with which one or more functional blocks and one or more wire segments extending in the first direction within the first reference frame are associated, the first reference frame having a reference line at a specified position in a second direction perpendicular to the first direction, and the position of each of the functional blocks and wire segments associated with the first reference frame specified by respective offset values relative to the reference line; and
after the routing and assigning steps, responsive to receiving an input from the input device indicating a desired movement of the first reference frame in the second direction, adjusting the specified position of the reference line while maintaining constant the offset values of the functional blocks and wire segments associated with the first reference frame.

15. The system of claim 14, wherein the plurality of operations further comprises:
prior to the assigning operation, arranging the layout of functional blocks in the rectangular portion; and
prior to the assigning operation, routing the plurality of interconnections among the functional blocks.

16. The system of claim 14, wherein the plurality of operations further comprises:
prior to the assigning operation, retrieving, from a memory resource, a database specifying the layout of the functional blocks and plurality of interconnections in the rectangular portion.

17. The system of claim 14, wherein the plurality of operations further comprises:
storing, in a memory resource, absolute position values, in the physical layout, of the functional blocks and wire segments associated with the first reference frame;
after the adjusting operation, recalculating the absolute position values of the functional blocks and wire segments associated with the first reference frame; and
storing the recalculated absolute position values in memory.

18. The system of claim 14, wherein the positions of a plurality of the wire segments associated with the first reference frame define endpoints of wire segments extending in the second direction to which the wire segments associated with the first reference frame are connected;
wherein the adjusting operation further comprises:
adjusting the endpoints of wire segments extending in the second direction to which the wire segments associated with the first reference frame are connected;
and wherein the routing operation further comprises:
defining the locations of vias between metal conductors in different metal levels of the integrated circuit at the endpoints of wire segments extending in the second direction to which the wire segments associated with the first reference frame are connected;
and wherein the adjusting step further comprises:
moving the locations of the vias.

19. The system of claim 14, wherein the offset values correspond to numbers of available wiring tracks extending in the first direction, at pluralities of positions in the rectangular portion along the second direction.

20. The system of claim 14, wherein the plurality of operations further comprises:

assigning a second reference frame extending in the second direction, and with which one or more functional blocks and one or more wire segments extending in the second direction within the second reference frame are associated, the second reference frame having a reference line at a specified position in the first direction, and the position of each of the functional blocks and wire segments associated with the second reference frame specified by respective offset values relative to the reference line; and after the routing and assigning operations, responsive to receiving a user input indicating a desired movement of the second reference frame in the first direction, adjusting the specified position of the reference line while maintaining constant the offset values of the functional blocks and wire segments associated with the second reference frame;

wherein each functional block in the rectangular portion is associated with at least one reference frame extending in the first direction and at least one reference frame extending in the second direction;

and wherein each interconnection wire segment wherein each interconnection wire segment in the rectangular portion is associated with either one or more reference frames extending in the first direction or one or more reference frames extending in the second direction.

21. A non-transitory computer-readable medium storing a computer program that, when executed on a computer system, causes the computer system to perform a sequence of operations for interactively modifying a layout of an integrated circuit, the layout including functional blocks arranged in a rectangular portion and including a plurality of interconnections among the functional blocks, each interconnection comprised of a plurality of orthogonal wire segments that each extend parallel to a side of the rectangular portion, the sequence of operations comprising:

assigning a first reference frame extending in a first direction parallel to a side of the rectangular portion, and with which one or more functional blocks and one or more wire segments extending in the first direction within the first reference frame are associated, the first reference frame having a reference line at a specified position in a second direction perpendicular to the first direction, and the position of each of the functional blocks and wire segments associated with the first reference frame specified by respective offset values relative to the reference line; and after the routing and assigning steps, responsive to receiving an input from the input device indicating a desired movement of the first reference frame in the second direction, adjusting the specified position of the reference line while maintaining constant the offset values of the functional blocks and wire segments associated with the first reference frame.

22. The computer-readable medium of claim 21, wherein the plurality of operations further comprises:

prior to the assigning operation, arranging the layout of functional blocks in the rectangular portion; and prior to the assigning operation, routing the plurality of interconnections among the functional blocks.

23. The computer-readable medium of claim 21, wherein the plurality of operations further comprises:

prior to the assigning operation, retrieving, from a memory resource, a database specifying the layout of the functional blocks and plurality of interconnections in the rectangular portion.

24. The computer-readable medium of claim 21, wherein the plurality of operations further comprises:

storing, in a memory resource, absolute position values, in the physical layout, of the functional blocks and wire segments associated with the first reference frame;

after the adjusting operation, recalculating the absolute position values of the functional blocks and wire segments associated with the first reference frame; and storing the recalculated absolute position values in memory.

25. The computer-readable medium of claim 21, wherein the positions of a plurality of the wire segments associated with the first reference frame define endpoints of wire segments extending in the second direction to which the wire segments associated with the first reference frame are connected;

wherein the adjusting operation further comprises:
adjusting the endpoints of wire segments extending in the second direction to which the wire segments associated with the first reference frame are connected;

and wherein the routing operation further comprises:
defining the locations of vias between metal conductors in different metal levels of the integrated circuit at the endpoints of wire segments extending in the second direction to which the wire segments associated with the first reference frame are connected;

and wherein the adjusting step further comprises:
moving the locations of the vias.

26. The computer-readable medium of claim 21, wherein the offset values correspond to numbers of available wiring tracks extending in the first direction, at pluralities of positions in the rectangular portion along the second direction.

27. The computer-readable medium of claim 21, wherein the plurality of operations further comprises:

assigning a second reference frame extending in the second direction, and with which one or more functional blocks and one or more wire segments extending in the second direction within the second reference frame are associated, the second reference frame having a reference line at a specified position in the first direction, and the position of each of the functional blocks and wire segments associated with the second reference frame specified by respective offset values relative to the reference line; and after the routing and assigning operations, responsive to receiving a user input indicating a desired movement of the second reference frame in the first direction, adjusting the specified position of the reference line while maintaining constant the offset values of the functional blocks and wire segments associated with the second reference frame;

wherein each functional block in the rectangular portion is associated with at least one reference frame extending in the first direction and at least one reference frame extending in the second direction;

and wherein each interconnection wire segment in the rectangular portion is associated with either one or more reference frames extending in the first direction or one or more reference frames extending in the second direction.

* * * * *